(12) United States Patent
Dwiliński et al.

(10) Patent No.: US 7,420,261 B2
(45) Date of Patent: Sep. 2, 2008

(54) BULK NITRIDE MONO-CRYSTAL INCLUDING SUBSTRATE FOR EPITAXY

(75) Inventors: Robert Dwiliński, Warsaw (PL); Roman Doradziński, Warsaw (PL); Jerzy Garczynski, Lomianki (PL); Leszek P. Sierzputowski, Union, NJ (US); Yasuo Kanbara, Anan (JP)

(73) Assignees: AMMONO Sp. z o.o., Warsaw (PL); Nichia Corporation, Anan-shi (JP)

( * ) Notice: Subject to any disclaimer, the term of this patent is extended or adjusted under 35 U.S.C. 154(b) by 92 days.

(21) Appl. No.: 11/589,058

(22) Filed: Oct. 30, 2006

(65) Prior Publication Data

US 2007/0040240 A1 Feb. 22, 2007

Related U.S. Application Data

(63) Continuation of application No. 10/493,747, filed as application No. PCT/PL02/00077 on Oct. 25, 2002, now Pat. No. 7,132,730.

(30) Foreign Application Priority Data

| Oct. 26, 2001 | (PL) | ................................. 350375 |
| Jun. 26, 2002 | (PL) | ................................. 354740 |

(51) Int. Cl.
| H01L 29/20 | (2006.01) |
| H01L 31/0304 | (2006.01) |
| H01L 29/00 | (2006.01) |
| H01L 29/06 | (2006.01) |
| H01L 29/12 | (2006.01) |

(52) U.S. Cl. ............... 257/615; 257/1; 257/9; 257/10; 257/11; 257/189; 257/200; 257/222; 257/289; 257/627; 257/628; 257/E33.023; 257/68

(58) Field of Classification Search .............. 257/1, 257/9–11, 68, 189, 200, 222, 289, 615, 627–628, 257/E33.023
See application file for complete search history.

(56) References Cited

U.S. PATENT DOCUMENTS

| 5,456,204 A | 10/1995 | Dimitrov et al. |
| 5,679,965 A | 10/1997 | Schetzina |
| 5,780,876 A | 7/1998 | Hata |
| 5,868,837 A | 2/1999 | DiSalvo et al. |
| 5,928,421 A | 7/1999 | Yuri et al. |
| 6,031,858 A | 2/2000 | Hatakoshi et al. |
| 6,046,464 A | 4/2000 | Schetzina |
| 6,051,145 A | 4/2000 | Griffith et al. |
| 6,067,310 A | 5/2000 | Hashimoto et al. |
| 6,139,628 A | 10/2000 | Yuri et al. |
| 6,156,581 A | 12/2000 | Vaudo et al. |
| 6,172,382 B1 | 1/2001 | Nagahama et al. |
| 6,177,057 B1 | 1/2001 | Purdy |
| 6,249,534 B1 | 6/2001 | Itoh et al. |
| 6,252,261 B1 | 6/2001 | Usui et al. |
| 6,265,322 B1 | 7/2001 | Anselm et al. |
| 6,270,569 B1 * | 8/2001 | Shibata et al. ............ 117/68 |
| 6,303,403 B1 | 10/2001 | Sato et al. |
| 6,329,215 B1 | 12/2001 | Porowski et al. |
| 6,372,041 B1 | 4/2002 | Cho et al. |
| 6,399,500 B1 | 6/2002 | Porowski et al. |
| 6,399,966 B1 | 6/2002 | Tsuda et al. |
| 6,423,984 B1 | 7/2002 | Kato et al. |
| 6,434,053 B1 * | 8/2002 | Fujiwara ............ 365/185.28 |
| 6,447,604 B1 | 9/2002 | Flynn et al. |
| 6,459,712 B2 | 10/2002 | Tanaka et al. |
| 6,468,882 B2 | 10/2002 | Motoki et al. |
| 6,488,767 B1 | 12/2002 | Xu et al. |
| 6,509,651 B1 | 1/2003 | Matsubara et al. |
| 6,531,072 B1 | 3/2003 | Suda et al. |
| 6,534,795 B2 | 3/2003 | Hori et al. |
| 6,586,762 B2 | 7/2003 | Kozaki |
| 6,593,589 B1 | 7/2003 | Osinski et al. |
| 6,614,824 B2 | 9/2003 | Tsuda et al. |
| 6,627,552 B1 | 9/2003 | Nishio et al. |
| 6,677,619 B1 | 1/2004 | Nagahama et al. |
| 6,686,608 B1 | 2/2004 | Takahira |
| 6,711,191 B1 | 3/2004 | Kozaki et al. |
| 6,720,586 B1 | 4/2004 | Kidoguchi et al. |
| 6,858,882 B2 | 2/2005 | Tsuda et al. |

| | | | |
|---|---|---|---|
| 6,924,512 | B2 | 8/2005 | Tsuda et al. |
| 7,057,211 | B2 | 6/2006 | Dwilinski et al. |
| 7,081,162 | B2 | 7/2006 | Dwilinski et al. |
| 7,097,707 | B2 | 8/2006 | Xu |
| 7,160,388 | B2 | 1/2007 | Dwiliński et al. |
| 7,291,544 | B2 | 11/2007 | D'Evelyn et al. |
| 2001/0008656 | A1 | 7/2001 | Tischler et al. |
| 2001/0022154 | A1 | 9/2001 | Cho et al. |
| 2001/0030328 | A1 | 10/2001 | Ishida |
| 2002/0014631 | A1 | 2/2002 | Iwata et al. |
| 2002/0031153 | A1 | 3/2002 | Niwa et al. |
| 2002/0047113 | A1 | 4/2002 | Ohno et al. |
| 2002/0063258 | A1 | 5/2002 | Motoki |
| 2002/0078881 | A1 | 6/2002 | Cuomo et al. |
| 2002/0189531 | A1 | 12/2002 | Dwilinski et al. |
| 2003/0143771 | A1 | 7/2003 | Kidoguchi et al. |
| 2003/0209191 | A1 | 11/2003 | Purdy |
| 2004/0031978 | A1 | 2/2004 | D'Evelyn et al. |
| 2004/0139912 | A1 | 7/2004 | Dwilinski et al. |
| 2004/0244680 | A1 | 12/2004 | Dwilinski et al. |
| 2004/0255840 | A1 | 12/2004 | Dwilinski et al. |
| 2006/0032428 | A1 | 2/2006 | Dwilinski et al. |
| 2006/0037530 | A1 | 2/2006 | Dwilinski et al. |

FOREIGN PATENT DOCUMENTS

| | | |
|---|---|---|
| CN | 1036414 A | 10/1989 |
| EP | 0 716 457 A | 6/1996 |
| EP | 0 711 853 B | 9/1999 |
| EP | 0 949 731 A | 10/1999 |
| EP | 0 973 207 A | 1/2000 |
| EP | 1 088 914 A | 4/2001 |
| FR | 2 796 657 A | 1/2001 |
| GB | 2 326 160 A | 12/1998 |
| GB | 2 333 521 A | 7/1999 |
| JP | 2-137287 A | 5/1990 |
| JP | 7-22692 B | 3/1995 |
| JP | 7-165498 A | 6/1995 |
| JP | 7-249830 A | 9/1995 |
| JP | 8-250802 A | 9/1996 |
| JP | 9-134878 A | 5/1997 |
| JP | 9-293897 A | 11/1997 |
| JP | 10-7496 A | 1/1998 |
| JP | 10-70079 A | 3/1998 |
| JP | 10-70338 A | 3/1998 |
| JP | 10-84161 A | 3/1998 |
| JP | 11-54847 A | 2/1999 |
| JP | 11-307813 A | 11/1999 |
| JP | 2000-82863 A | 3/2000 |
| JP | 2000-82867 A | 3/2000 |
| JP | 2000-216494 A | 8/2000 |
| JP | 2001-85737 A | 3/2001 |
| JP | 2001-342100 A | 12/2001 |
| JP | 2003-40699 A | 2/2003 |
| JP | 2004-168656 A | 6/2004 |
| WO | WO 98/55671 A | 12/1998 |
| WO | WO 01/24284 A | 4/2001 |
| WO | WO 01/24921 A | 4/2001 |
| WO | WO 02/101120 A | 12/2002 |

OTHER PUBLICATIONS

Porowski, S., "High Pressure Growth of GaN—New Prospects for Blue Lasers", Journal of Crystal Growth, 1996, pp. 583-589, vol. 166, Elsevier Science B.V.

Chu, T. L. et al., "Crystal Growth and Characterization of Gallium Nitride", J. Electrochem. Soc., Solid-State Science and Technology, Jan. 1974, pp. 159-162, vol. 121, No. 1.

Sakagami, N. et al., "Growth Kinetics and Morphology of ZnO Single Crystal Grown under Hydrothermal Conditions", Journal of Ceramic Association, 1974, pp. 405-413, vol. 82, No. 8.

Hirano, S. et al., "Hydrothermal Synthesis of Gallium Orothphosphate Crystals", Bull. Chem. Soc. Japan., 1989, pp. 275-278, vol. 62, The Chemical Society of Japan.

Akasaki, I. et al., "Growth and Properties of Single Crystalline GaN Films by Hydride Vapor Phase Epitaxy", Crystal Properties and Preparation, 1991, pp. 154-157, vol. 32-34, Trans Tech Publications, Switzerland.

Hirano, S. et al., "Growth of Gallium Orthophosphate Single Crystals in Acidic Hydrothermal Solutions", Journal of Materials Science, 1991, pp. 2805-2808, vol. 26, Chapman and Hall Ltd.

Laudise, R. A., "What is Materials Chemistry?" Materials for Non-linear Optics, 1991, pp. 410-433, American Chemical Society.

Porowski, S. et al., "Prospects for High-Pressure Crystal Growth of III-V Nitrides", Inst. Phys. Conf. Ser., 1993, pp. 369-372, No. 137, Chapter 4, Silicon Carbide and Related Materials.

Pakula, K., et al., "Growth of GaN Metalorganic Chemical Vapour Deposition Layers on GaN Single Crystals", Acta Physica Polonica A, 1995, pp. 861-864, vol. 88, No. 5.

Dwiliński, R. et al., "On GaN Crystallization by Ammonothermal Method", ACTA Physica Polonica A, 1996, pp. 763-766, vol. 90, No. 4.

Yanagisawa, K. et al., "Hydrothermal Single Crystal Growth of Calcite in Ammonium Acetate Solution", Journal of Crystal Growth, 1996, pp. 285-294, vol. 163, Elsevier Science B.V.

Kelly, M. et al., "Optical Patterning of GaN Films", Applied Physics Letters, Sep. 1996, pp. 1749-1751, vol. 69, No. 12, American Institute of Physics.

Kuramata, A. et al., "Substrate for III-V Group Nitride Semiconductors", Oyo Buturi, 1996, pp. 936-940, vol. 65, No. 9, Japan.

"Chapter 1 Single Crystal Growth", Hydrothermal Synthesis Handbook, 1997, pp. 245-255, Gihodo Press.

Dwiliński, R. et al., "Exciton Photo-Luminescence of GaN Bulk Crystals Grown by The Ammono Method", Materials Science and Engineering, 1997, pp. 46-49, vol. 50, No. 1-3, Elsevier Science S.A.

Balkas, C.M. et al., "Growth of Bulk AlN and GaN Single Crystals by Sublimation", Mat. Res. Soc. Symp. Proc., 1997, pp. 41-46, vol. 449, Materials Research Society.

Dwiliński, R. et al., "Ammono Method of GaN and AlN Production", Diamond and Related Materials, 1998, pp. 1348-1350, vol. 7, Elsevier Science S.A.

Yamane, H. et al., "Polarity of GaN Single Crystals Prepared With Na Flux", Japanese Journal of Applied Physics, Jun. 1998, pp. 3436-3440, vol. 37, No. 6A, Publication Board Japanese of Applied Physics, Tokyo, Japan.

Dwiliński, R. et al., "Ammono Method of BN, AlN and GaN Synthesis and Crystal and Crystal Growth", MRS Internet Journal Nitride Semiconductor Research, 1998, pp. 1-4, vol. 3. No. 25, Retrieved from the Internet: URL: http://nsr.mij.mrs.org/3/25.

Melnik, Y. et al., "Properties of Free-Standing GaN Bulk Crystals Grown by HVPE", Mat. Res. Soc. Symp. Proc., 1998, pp. 269-274, vol. 482, Materials Research Society.

Porowski S., "Bulk and Homoepitaxial GaN-Growth and Characterisation", Journal of Crystal Growth, 1998, pp. 153-158, 189/190 Elsevier Science B.V.

Palczewska, M. et al., "Paramagnetic Defects in GaN"MRS Internet Journal Nitride Semiconductor Res., 1998, pp. 1-3, vol. 3, No. 45, The Materials Research Society.

Kuroda, N. et al., "Precise Control of PN-Junction Profiles for GaN-Based LD Structures Using GaN Substrates with Low Dislocation Densities", Journal of Crystal Growth, 1998, pp. 551-555, vol. 189-190, Elsevier Science B.V.

Kim, S. T. et al., "Preparation and Properties of Free-Standing HVPE Grown GaN Substrates", Journal of Crystal Growth, 1998, pp. 37-42, vol. 194, Elsevier Science B.V.

Wong, W. et al., "Fabrication of Thin-Film InGaN Light-Emitting Diode Membranes by Laser Lift-Off", Applied Physics Letters, Sep. 1999. pp. 1360-1362, vol. 75, No. 10, American Institute of Physics.

Yano, M. et al., "Control of Nucleation Site and Growth Orientation of Bulk GaN Crystals", Japanese Journal of Applied Physics, Oct. 1999, pp. L1121-L1123, vol. 38, No. 10A, Part 2, Publication Board Japanese Journal of Applied Physics, Tokyo, Japan.

Kaschner, A. et al., "Influence of Doping on The Lattice Dynamics of Gallium Nitride", MRS Internet J. Nitride Semicond. Res., 1999, 6 pages, No. 4S1, G3.57.

Brandt, O. et al., "Critical Issues for the Growth of High-Quality (Al, Ga)N/GaN and GaN(In, Ga)N Heterostructures on SiC(0001) by Molecular-Beam Expitaxy", Applied Physics Letters, Dec. 1999, pp. 4019-4021, vol. 75, No. 25, American Institute of Physics.

Oda, O. et al., "GaN Bulk Substrates for GaN Based LEDs and LDs", Physica Status Solidi (a) Applied Research, Mar. 6, 2000, pp. 51-58, vol. 180, No. 1.

Mao, X. et al., "New Concept Technology Pressure-Variation Liquid Phase Epitaxy", SPIE Photonics Taiwan Conference Proceedings, Jul. 2000, pp. 1-12.

Waltereit, P. et al., "Nitride Semiconductors Free of Electrostatic Fields for Efficient White Light-Emitting Diodes", Letters to Nature, Aug. 2000, pp. 865-868, vol. 406.

Aoki, M. et al., "Growth of GaN Single Crystals From A Na-Ga Melt at 750° C and 5MPa of $N_2$", Journal of Crystal Growth, Sep. 2000, pp. 7-12, vol. 218, No. 1, Elsevier Science B.V.

Sekiguchi, T. et al., "Hydrothermal Growth of ZnO Single Crystals and Their Optical Characterization", Journal of Crystal Growth, 2000, pp. 72-76, vol. 214/215, Elsevier Science B.V.

Motoki, K. et al., "Preparation of Large Freestanding GaN Substrates by Hydride Vapor Phase Epitaxy Using GaAs as a Starting Substrate", Jpn. J. Appl. Phys., Feb. 2001, pp. L140-L143, vol. 40, Part 2, No. 2B.

Grzegory, I., "High Pressure Growth of Bulk GaN from Solutions in Gallium", Journal of Physics Condensed Matter, Jul. 26, 2001, pp. 6875-6892, vol. 13, No. 32, Institute of Physics Publishing.

Yanagisawa, K. et al., "Improvement of Quality of Hydrothermally Grown Calcite Single Crystals", Journal of Crystal Growth, 2001, pp. 440-444, vol. 229, Elsevier Science B.V.

Ketchum, D. et al., "Crystal Growth of Gallium Nitride in Supercritical Ammonia", Journal of Crystal Growth, 2001, pp. 431-434, vol. 222, Elsevier Science B.V.

Fukuda, M., "Optical Semiconductor Devices", Wiley Series in Microwave and Optical Engineering, 1998, p. 7, John Wiley & Sons, Inc., New York.

Sze, S. M. (Editor), "Modern Semiconductor Device Physics", A Whiley Interscience Publication, 1998, pp. 539-540, John Wiley & Sons, Inc., New York.

\* cited by examiner

*Primary Examiner*—Ida M Soward
(74) *Attorney, Agent, or Firm*—Smith Patent Office

(57) ABSTRACT

The invention relates to a substrate for epitaxy, especially for preparation of nitride semiconductor layers. Invention covers a bulk nitride mono-crystal characterized in that it is a mono-crystal of gallium nitride and its cross-section in a plane perpendicular to c-axis of hexagonal lattice of gallium nitride has a surface area greater than 100 $mm^2$, it is more than 1,0 µm thick and its C-plane surface dislocation density is less than $10^6/cm^2$, while its volume is sufficient to produce at least one further-processable non-polar A-plane or M-plane plate having a surface area at least 100 $mm^2$. More generally, the present invention covers a bulk nitride mono-crystal which is characterized in that it is a mono-crystal of gallium-containing nitride and its cross-section in a plane perpendicular to c-axis of hexagonal lattice of gallium-containing nitride has a surface area greater than 100 $mm^2$, it is more 1,0-µm thick and its surface dislocation density is less than $10^6/cm^2$. Mono-crystals according to the present invention are suitable for epitaxial growth of nitride semiconductor layers. Due to their good crystalline quality they are suitable for use in opto-electronics for manufacturing opto-electronic semiconductor devices based on nitrides, in particular for manufacturing semiconductor laser diodes and laser devices. The a.m. bulk mono-crystals of gallium-containing nitride are crystallized on seed crystals. Various seed crystals may be used. The bulk mono-crystals of gallium-containing nitride are crystallized by a method involving dissolution of a gallium-containing feedstock in a supercritical solvent and crystallization of a gallium nitride on a surface of seed crystal, at temperature higher and/or pressure lower than in the dissolution process.

26 Claims, 14 Drawing Sheets

Fig. 16-A
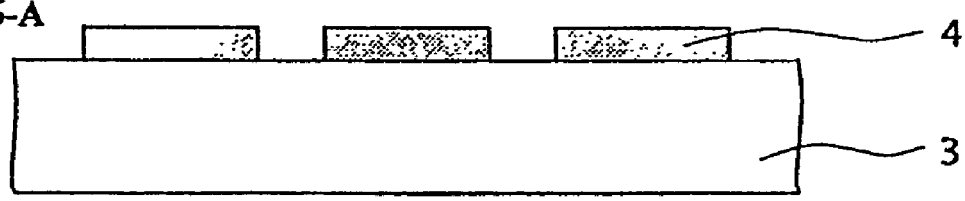
Fig. 16-B
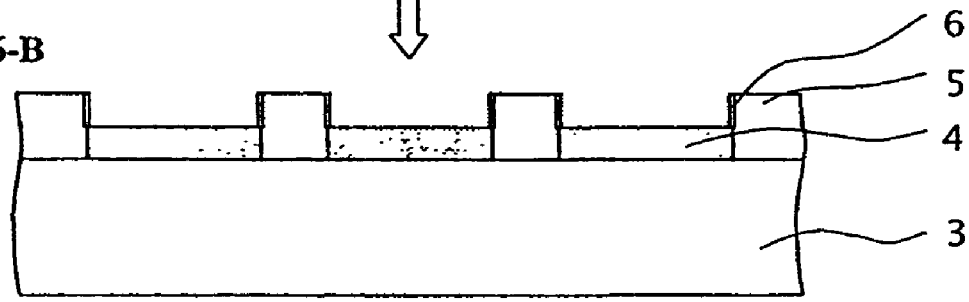
Fig. 16-C
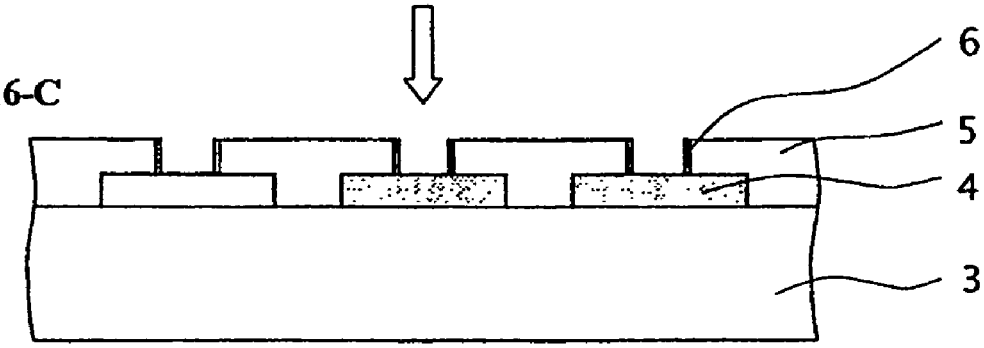
Fig. 16-D
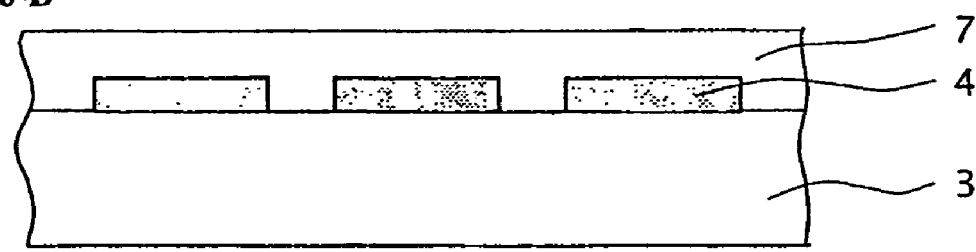

Fig. 17
Fig. 17-A
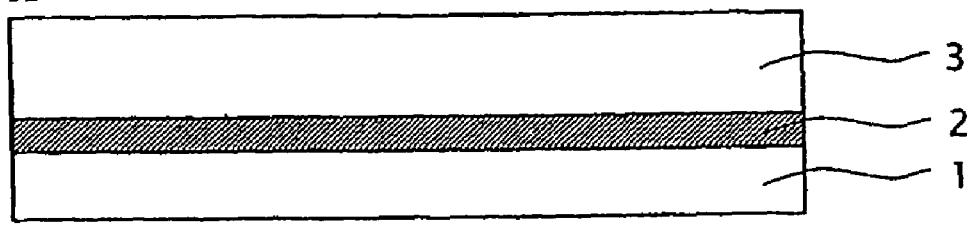
Fig. 17-B
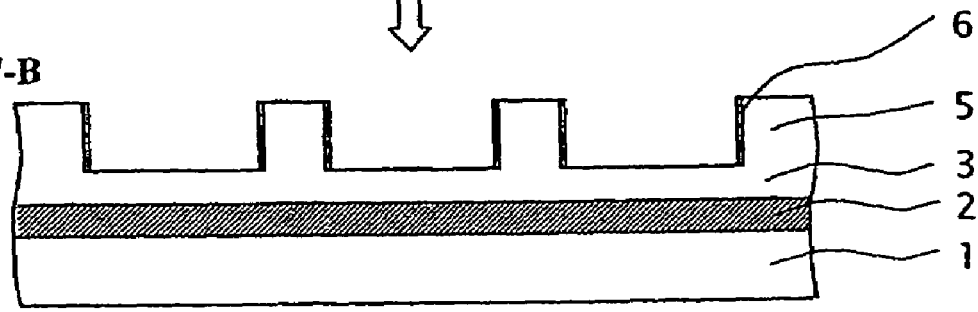
Fig. 17-C
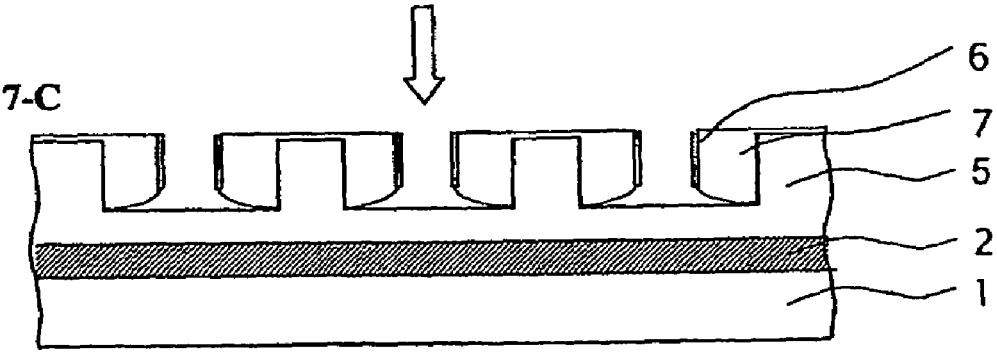
Fig. 17-D
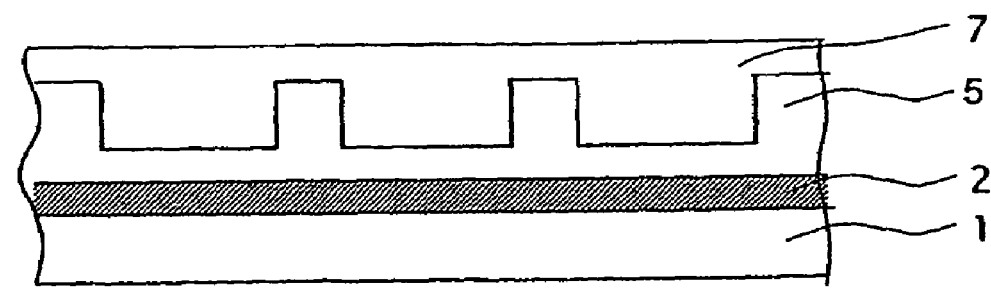

BULK NITRIDE MONO-CRYSTAL INCLUDING SUBSTRATE FOR EPITAXY

CROSS REFERENCE TO RELATED APPLICATIONS

This application is a continuation application of U.S. patent application Ser. No. 10/493,747 filed Apr. 26, 2004, now U.S. Pat. No. 7,132,730, which was the National Stage of International Application No. PCT/PL02/00077, filed on Oct. 25, 2002. The disclosures of U.S. patent application Ser. No. 10/493,747 and International Application No. PCT/PL02/00077 are hereby incorporated by reference.

BACKGROUND OF THE INVENTION

1. Field of the Invention

The invention relates to a bulk nitride mono-crystal especially for use as a substrate for epitaxy. Such a substrate for epitaxy is particularly suitable for preparation of nitride semiconductor layers in a process for manufacturing of various opto-electronic devices.

Known nitride-based opto-electronic devices are manufactured on sapphire or silicon-carbide substrates, differing from the thereafter deposited nitride layers (i.e. heteroepitaxy).

2. Description of the Related Art

In the most commonly used Metallo-Organic Chemical Vapor Deposition (MOCVD) method, GaN depositing is performed from ammonia and metallo-organic compounds from the gaseous phase, and the growth rates attained make it impossible to receive a bulk layer. However, MOCVD cannot produce a bulk crystal having a substantial thickness. In order to reduce surface dislocation density a buffer layer is first deposited on sapphire or silicon substrate. However, the reduction of surface dislocation density achieved is not bigger than to about $10^8/cm^2$.

Another method that has been proposed for the manufacturing of bulk mono-crystalline gallium nitride, involves epitaxial depositing using halogens in the gaseous phase and is called Halide Vapor Phase Epitaxy (HVPE) ["Optical patterning of GaN films" M. K. Kelly, O. Ambacher, Appl. Phys. Lett. 69 (12) (1996) and "Fabrication of thin-film InGaN light-emitting diode membranes" W. S. Wong, T. Sands, Appl. Phys. Lett. 75 (10) (1999)]. The method allows generation of GaN substrates 2 inches in diameter, but the quality is insufficient for application in laser diodes, because the surface density of defects still remains in the $10^7$ to $10^9/cm^2$ range. Besides, the HVPE GaN substrates have tilted crystal axes because of distortion caused by epitaxial growth on hetero-substrates, for example on sapphire.

Recently, defect density decrease is attained by using the Epitaxial Lateral Overgrowth (ELOG) method. In this method, a GaN layer is first grown on the sapphire substrate, and then $SiO_2$ is deposited in the form of strips or grids. Next, such a substrate may be used for lateral GaN growing, reducing the defects density to about $10^7/cm^2$.

Due to significant differences in chemical, physical, crystallographic and electrical properties of substrates such as sapphire or silicon carbide and semiconductor nitride layers deposited thereon by hetero-epitaxy, big technological effort is needed to advance progress in opto-electronics.

On the other hand growth of bulk crystals of gallium nitride and other nitrides of Group XIII elements is also extremely difficult (numbering of the Groups is given according to the IUPAC convention of 1989 throughout this application). Standard methods of crystallization from alloy and sublimation methods are not applicable because of decomposition of the nitrides into metals and $N_2$. In the High Nitrogen Pressure (HNP) method ["Prospects for high-pressure crystal growth of III-V nitrides" S. Porowski et al., Inst. Phys. Conf. Series, 137, 369 (1998)] decomposition is inhibited by applying a nitrogen atmosphere under high pressure. Growth of crystals is carried out in melted gallium, i.e. in the liquid phase, resulting in production of GaN platelets about 10 mm in size. Sufficient solubility of nitrogen in gallium requires temperatures of about 1500° C. and nitrogen pressures of the order of 1500 MPa.

In another known method, supercritical ammonia was proposed to lower the temperature and decrease pressure during the growth process. It was proven in particular that it is possible to obtain crystalline gallium nitride by synthesis from gallium and ammonia, provided that the latter contains alkali-metal amides ($KNH_2$ or $LiNH_2$). The processes were conducted at temperatures of up to 550° C. and pressure 500 MPa, yielding crystals of about 5 μm in size ["AMMONO method of BN, AlN, and GaN synthesis and crystal growth" R. Dwiliński et al., Proc. EGW-3, Warsaw, Jun. 22-24, 1998, MRS Internet Journal of Nitride Semiconductor Research, http://nsr.mij.mrs.org/3/25].

Use of supercritical ammonia also allowed recrystallization of gallium nitride within the feedstock comprising finely crystalline GaN ["Crystal Growth of gallium nitride in supercritical ammonia" J. W. Kolis et al., J. Cryst. Growth 222, 431-434 (2001)]. Recrystallization was made possible by introduction of amide ($KNH_2$) into supercritical ammonia, along with a small quantity of a halogen (KI). Processes conducted at 400° C. and 340 MPa gave GaN crystals about 0.5 mm in size. However, no chemical transport processes were observed in the supercritical solution, in particular no growth on seeds.

The thus obtained nitride mono-crystals are of no industrial use as substrates for epitaxy, mainly because of their insufficient size and irregular shape.

Lifetime of optical semiconducting devices depends primarily on crystalline quality of the optically active layers, and especially on surface dislocation density. In case of GaN-based laser diodes, it is beneficial to lower dislocation density in the GaN substrate layer to less than $10^6/cm^2$, and this is extremely difficult in the methods used so far. On the other hand industrial processes for manufacturing such optical semiconducting devices can be performed only on reproducible substrates meeting strict quality specifications.

BRIEF SUMMARY OF THE INVENTION

The present invention aims to provide a bulk nitride mono-crystal, especially for use as a substrate for epitaxy, having quality allowing its use in opto-electronics and electronics. This aim has been achieved by developing a bulk nitride mono-crystal, especially for use as a substrate for epitaxy as defined in the appended claims.

A bulk nitride mono-crystal according to the present invention has parameters as defined in the independent claims 1 and 12, while the preferred features of the same are defined in the respective dependent claims. The present invention relates also to the use of the bulk nitride mono-crystal as a substrate for epitaxy.

The present invention relates to a bulk nitride mono-crystal characterized in that it is a mono-crystal of gallium nitride and its cross-section in a plane perpendicular to c-axis of hexagonal lattice of gallium nitride has a surface area greater than 100 mm², it is more than 1.0 μm thick and its C-plane surface dislocation density is less than $10^6/cm^2$, while its volume is sufficient to produce at least one further-processable non-polar A-plane or M-plane plate having a surface area preferably at least 100 mm².

The present invention relates also to a bulk nitride mono-crystal characterized in that it is a mono-crystal of gallium-containing nitride and its cross-section in a plane perpendicular to c-axis of hexagonal lattice of gallium nitride has a surface area greater than 100 mm², it is more than 1.0 μm thick and its C-plane surface dislocation density is less than $10^6$/cm².

A bulk mono-crystal of gallium-containing nitride according to the present invention is crystallized on the surface of a seed crystal with at least a crystalline layer of gallium-containing nitride, having a dislocation density less than $10^6$/cm².

A bulk mono-crystal of gallium-containing nitride according to the present invention may be additionally doped with donor and/or acceptor and/or magnetic dopants in concentrations from $10^{17}$/cm³ to $10^{21}$/cm³, depending on the properties required for the intended use of the same, for example as a substrate for epitaxy.

In the particularly preferred embodiment a bulk mono-crystal of gallium-containing nitride according to the present invention has a dislocation density close to $10^4$/cm² and at the same time the FWHM of the X-ray rocking curve from (0002) plane is close to 60 arcsec.

The bulk nitride mono-crystal according to the invention—suitable for use as a substrate for epitaxy—is obtained by a method involving dissolution of a respective Group XIII elements feedstock in a supercritical solvent and crystallization of a desired gallium-containing nitride on a surface of seed crystal, with over-saturation of the supercritical solution with respect to the desired gallium-containing nitride being reached by means of temperature gradient and/or pressure change.

It is obtained by a method involving dissolution of a feedstock containing Group XIII elements in a supercritical solvent and crystallization of a gallium-containing nitride on a surface of seed crystal, at temperature higher and/or pressure lower than in the dissolution process.

The supercritical solvent contains $NH_3$ and/or its derivatives, and includes ions of elements of Group I—at least potassium or sodium ions, the feedstock consists essentially of gallium-containing nitride and/or its precursors, selected from a group including azides, imides, amido-imides, amides, hydrides, gallium-containing metal compounds and alloys, as well as metallic elements of Group XIII preferably metallic gallium.

According to the present invention, crystallization of a bulk mono-crystal of gallium-containing nitride takes place in an autoclave, at temperatures from 100° C. to 800° C. and at pressures from 10 MPa to 1000 MPa and a molar ratio of alkali metal ions to the remaining components of the supercritical solvent ranges from 1:200 to 1:2.

Depositing a bulk mono-crystal of gallium-containing nitride may include lateral growth of gallium-containing nitride on a plurality of surfaces susceptible for such growth, placed on a crystal seed and spaced apart from each other.

The substrate for epitaxy according to the present invention has at least one surface suitable for epitaxial growth of semi-conducting nitride layers without any additional pre-treatment.

In the preferred embodiment, the present invention relates to a bulk nitride mono-crystal grown in a direction parallel to c-axis of hexagonal lattice of gallium nitride seed in a supercritical $NH_3$ containing gallium-complex compounds at Ga:$NH_3$ molar ratio of more than 1:50, in order to have a thickness high enough to obtain at least one further-processable A-plane or M-plane gallium-nitride substrate.

In still further preferred embodiment, the present invention relates to a bulk nitride mono-crystal grown on a seed having no substantial tilted crystal axis by means of a supercritical $NH_3$ containing gallium-complex compounds, having not so much surface roughness as to decrease lifetime of a nitride semiconductor device formed thereon.

BRIEF DESCRIPTION OF THE DRAWINGS

The accompanying drawings illustrate the present invention.

FIG. 3a presents SIMS (Secondary Ion Mass Spectroscopy) profiles of a sample of a bulk nitride mono-crystal, especially for use as a substrate for epitaxy according to the invention with a high Group I metals content, while

FIGS. 16-18 illustrate subsequent phases of manufacturing three exemplary bulk nitride mono-crystals according to the present invention-formed by lateral growth method.

DETAILED DESCRIPTION OF THE INVENTION

Figure 1:
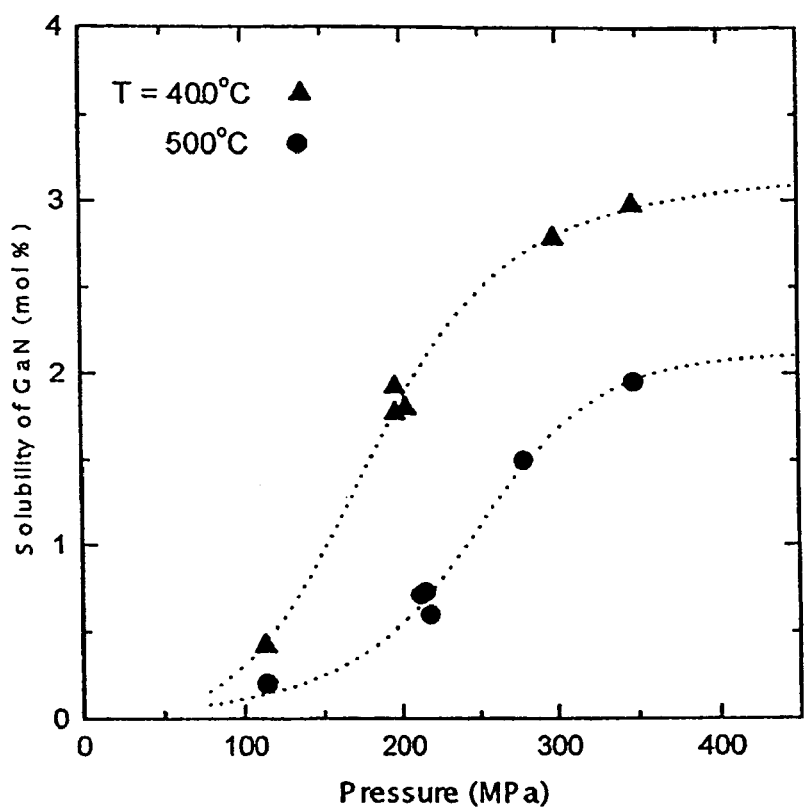
FIG. 1 shows a dependence of GaN solubility in supercritical ammonia containing potassium amide (at molar ratio of $KNH_2$:$NH_3$=0.07) on pressure at T=400° C. and T=500° C.

In the present invention the following definitions apply.

Gallium-containing nitride means a nitride of gallium and optionally other element(s) of group XIII. It includes, but is not restricted to, the binary compound GaN, ternary compounds such as AlGaN, InGaN and also AlInGaN, where the ratio of the other elements of group XIII to Ga can vary in a wide range.

Bulk mono-crystal of gallium-containing nitride means a mono-crystal especially for use as a substrate for epitaxy made of gallium-containing nitride from which opto-electronic devices such as LED or LD can be formed by epitaxial methods such as MOCVD and HVPE.

A further-processable non-polar A- or M-plane plate means a plate possessing A- or M-plane surfaces which are suitable for epitaxial deposition of nitride layers, and for manufacturing thereon of at least one nitride opto-electronic device, preferably a nitride semiconductor laser structure. Such a plate should be of a size allowing further processing by MOCVD, MBE or other methods of epitaxial deposition thereon of nitride layers, the surface area being preferably higher than 10 mm$^2$, most preferably higher than 100 mm$^2$.

Supercritical solvent means a fluid in a supercritical state. Essentially, the supercritical solvent contains a nitrogen-containing solvent and ions of alkali metals. It can also contain other components in addition to the solvent itself as long as these components do not substantially influence or disturb function of supercritical solvent.

Supercritical solution is used when referring to the supercritical solvent when it contains Group XIII element(s), in particular gallium—in a soluble form originating from the dissolution of feedstock containing Group XIII element(s), in particular gallium.

Dissolution of feedstock means a process (either reversible or irreversible) in which said feedstock is taken up to the supercritical solvent as Group XIII element(s), in particular gallium in a soluble form, possibly Group XIII element(s)-complex compounds, in particular gallium-complex compounds.

Group XIII element(s)-complex compounds, in particular gallium-complex compounds are complex compounds, in which a Group XIII element(s), in particular gallium atom is a coordination center surrounded by ligands, such as $NH_3$ molecules or its derivatives, like $NH_2^-$, $NH^{2-}$, etc.

Over-saturation of supercritical solution with respect to gallium-containing nitride means that the concentration of gallium in a soluble form in said solution is higher than that in equilibrium (i.e. it is higher than solubility). In the case of dissolution of gallium-containing nitride in a closed system, such an over-saturation can be achieved by either increasing the temperature and/or decreasing the pressure.

Autoclave means a closed container which has a reaction chamber where the ammonobasic process according to the present invention is carried out.

When evaluating the properties of a bulk nitride mono-crystal of the present invention various parameters can be measured and various evaluation methods can be employed, all well known in the art.

One of the important parameters is (Surface) Dislocation Density. In some publications the term "Etch Pit Density" (or EPD) is used when quality of a nitride mono-crystal is discussed. It has been already proved by microscopic observations that crystals can be etched more efficiently in near-dislocation region. So, if the amount of dislocations is not too high, counting of etch pits is the easiest way of determining of dislocation density. However, used etching procedure should be confirmed by TEM measurements. When evaluating the surface dislocation density of bulk nitride mono-crystals of the present invention the values of the parameter were obtained from the cathodoluminescence maps by microscopic observation of dark points on the surface of electron-beam-excited crystal. Such dark points could be near-dislocation regions, due to creation of irradiative recombination centers. This is another technique of determining of dislocation density and the results obtained have been confirmed by TEM measurements. Throughout the present specification Dislocation Density and EPD are used as equivalent terms.

Measurements of FWHM of the X-ray rocking curve and SIMS (Secondary Ion Mass Spectroscopy) profiles of the samples of bulk nitride mono-crystals according to the invention were employed in a course of evaluation of the quality of the samples obtained.

In accordance with the present invention a bulk mono-crystal of gallium-containing nitride have both large size and high quality. Such a bulk mono-crystal of gallium-containing nitride can have a surface area of more than 2 cm$^2$ and a surface dislocation density of less than $10^6$/cm$^2$, having a thickness of at least 200 µm (preferably at least 500 µm) and FWHM of X-ray rocking curve from (0002) plane of 50 arcsec or less.

Such mono-crystals can be grown on gallium-containing nitride crystal seeds and in turn they may subsequently serve as seeds for next mono-crystal growth processes.

As it was explained above, a bulk mono-crystal of gallium-containing nitride is a crystal of gallium nitride and optionally other element(s) of Group XIII. These compounds can be represented by the formula $Al_xGa_{1-x-y}In_yN$, wherein $0 \leq x < 1$, $0 \leq y < 1$, $0 \leq x+y < 1$. Although in a preferred embodiment the gallium-containing nitride is gallium nitride, in a further preferred embodiment part (e.g. up to 50 mol.-%) of the gallium atoms can be replaced by one or more other elements of Group XIII (especially Al and/or In).

According to the invention a bulk mono-crystal of gallium-containing nitride may additionally include at least one donor and/or at least one acceptor and/or at least one magnetic dopant to alter the optical, electrical and magnetic properties of the substrate. Donor dopants, acceptor dopants and magnetic dopants are well-known in the art, and can be selected according to the desired properties of the substrate. Preferably the donor dopants are selected from the group consisting of Si and O. As acceptor dopants Mg and Zn are preferred. Any known magnetic dopant can be included into the substrate of the present invention. A preferred magnetic dopant is Mn and possibly also Ni and Cr. The concentrations of the donor and acceptor dopants are well-known in the art and depend on the desired end application of the nitride. Typically, concentrations of these dopants range from $10^{17}$ to $10^{21}$/cm$^3$.

Due to the production process, the bulk mono-crystal of gallium-containing nitride can also contain alkali elements, usually in an amount of more than about 0.1 ppm. Generally it is desired to keep the alkali-elements content lower than 10 ppm, although it is difficult to specify what concentration of alkali metals in a bulk mono-crystal of gallium-containing nitride has a disadvantageous influence on its properties.

A bulk mono-crystal of gallium-containing nitride may additionally comprise traces of Ti, Fe, Co, Cr, and Ni introduced in the production process in effect of corrosion of the autoclave under the process condition. Such trace impurities do not adversely affect the use of the mono-crystal of the present invention as a substrate for epitaxy.

Generally, halogens are not intentional components of a bulk mono-crystal of gallium-containing nitride of the present invention. However, it is also possible that halogens are present therein. It is usually desired to keep the halogen content of a bulk mono-crystal of gallium-containing nitride in the range of about 0.1 ppm or less.

According to the present invention a bulk mono-crystal of gallium-containing nitride is crystallized on a surface of a seed crystal.

The seed crystals for crystallization of a substrate for epitaxy according to the invention can be obtained by a number of known methods, described in details in literature. Various seed crystals may be used, both homo-seeds and hetero-seeds. Generally, a seed crystal consists of gallium-containing nitride (homo-seed) or at least contains a layer of such a nitride (hetero-seed).

Crystals of gallium-containing nitride suitable for use as seed crystals are obtained by above described known methods. For example gallium-nitride crystals may be obtained in effect of spontaneous crystallization from a supercritical ammonia solution. Suitable seed crystals may be obtained by methods of synthesis of GaN based on heteroepitaxial deposition, involving halogens in gaseous phase (HVPE). This method is suitable for a reproducible manufacturing of big size seed crystals, having even ca. 5 cm in diameter. Such crystals are available from a number of sources, among others they are produced by NICHIA, ATMI, TDI, SUMITOMO and other manufacturers. Seed crystals can be also obtained by HNP method, under which growth of GaN crystals occurs spontaneously in molten gallium under a high pressure nitrogen atmosphere. Recently a paper "Growth of bulk GaN single crystals by the pressure-controlled solution growth method" by T. Inoue, Y. Seki, O. Oda, S. Kurai, Y. Yamada and T. Taguchi was published in J. Cryst. Growth 229, 35-40 (2001). The authors described a method for producing GaN, similar to HNP method, however crystal growth is initiated by a slow increase of nitrogen pressure and simultaneously maintaining a uniform temperature and not by generating a temperature difference within a crucible with a molten gallium. It was reported that the method allows growing GaN mono-crystals having up to 10 mm in diameter. Still further method suitable for obtaining seed crystals involves melting a mixture of sodium azide, metallic gallium and metallic sodium. With increasing temperature sodium azide decomposes and releases atomic nitrogen, which in turn reacts with gallium, forming a desired gallium nitride.

In a preferred embodiment a bulk mono-crystal of gallium containing nitride may be formed on a primary substrate by means of lateral overgrowth. A primary substrate as described below should be considered to be a particular seed crystal, and various materials can be used to form such a substrate including homo-seed crystals in form of flat wafers or hetero-seeds on which a buffer gallium-containing nitride layer is needed.

As it is illustrated in FIG. 16, surfaces 6 susceptible to lateral overgrowth can be formed by partial covering of primary substrate 3 with a mask layer 4. Over such mask layer 4 a bulk mono-crystal of gallium-containing nitride 7 is formed as a result of lateral overgrowth by a method involving dissolution of a feedstock containing Group XIII elements in a supercritical solvent containing ammonia, and crystallization of a gallium-containing nitride on surfaces 6, at temperature higher and/or pressure lower than in the dissolution process. Thus, it is crucial that mask layer 4 is insoluble or hardly soluble in supercritical solution containing ammonia. Such a mask layer 4 may consist for example of metallic silver—Ag. Also all or some remaining surfaces of the primary substrate may be covered by such a mask layer.

As it is shown in FIG. 17, a bulk mono-crystal of gallium containing nitride 7, obtained by lateral overgrowth may also be obtained on a primary substrate 3 having a surface in form of stripes 5. In such a case nitride layer 7 is formed on a side walls 6 of stripes 5. Lateral overgrowth of bulk mono-crystal of gallium containing nitride may be also carried out on selected side walls 6 only.

Figure 18:
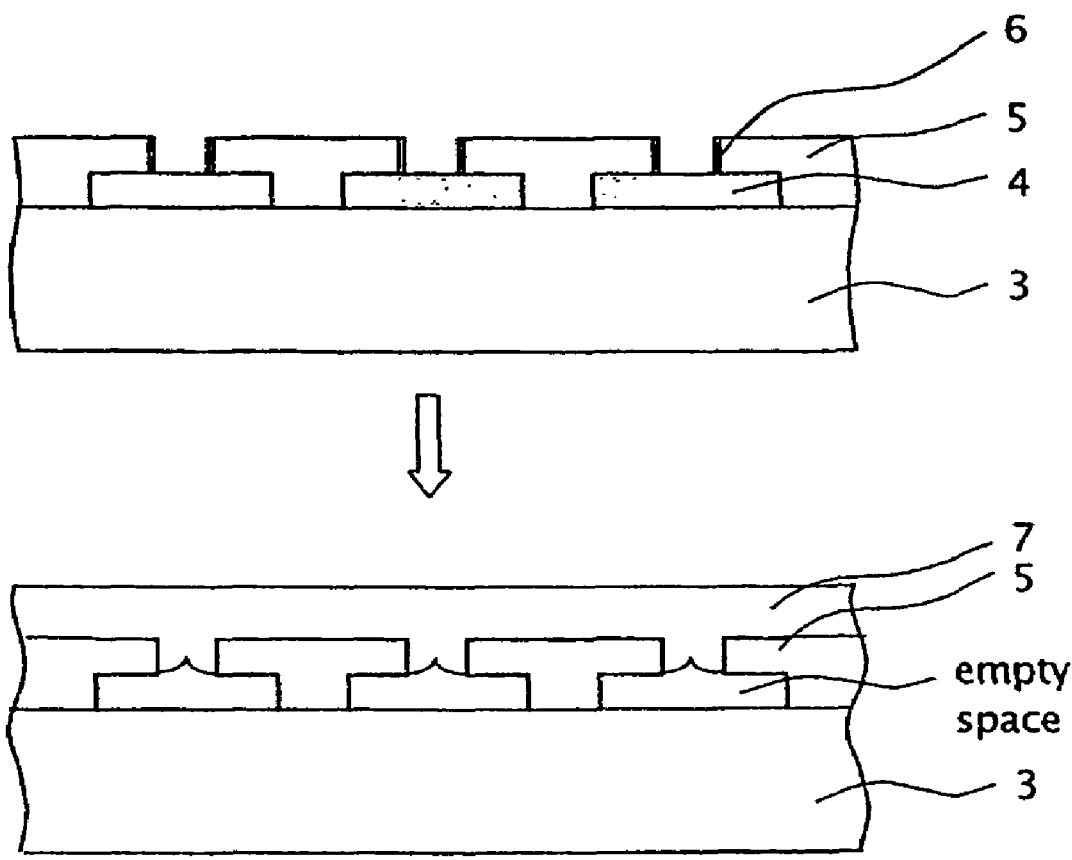

As it is shown in FIG. 18, a bulk mono-crystal of gallium containing nitride 7 may be formed on a part of a primary substrate 3 only. In effect, a surface dislocation density of a nitride layer 7 is substantially lower than dislocation density of a primary substrate 3. In this case a primary substrate 3 is covered in part only with a mask layer 4, and a nitride layer 5 is grown from the openings in a mask layer 4 upward and laterally. In such a manner stripes made of nitride semiconductor are obtained, having a T-shape cross-section. Afterwards, mask layer 4 is removed and a primary substrate 3 covered with stripes having the T-shape cross-section is obtained. On the side walls of the stripes a bulk mono-crystal gallium containing nitride 7 is formed by lateral overgrowth.

Gallium-containing nitride seed crystals, having the same composition as a bulk mono-crystal of gallium-containing nitride, are used as homo-seed crystals. Preferably the nitride consists essentially of gallium nitride. Also hetero-seeds made—as described above—of sapphire or silicon carbide, with a buffer layer of gallium-containing nitride on at least one surface and a mask covering all the remaining surfaces of such a hetero-seed may be used. In such a case a bulk mono-crystal of gallium-containing nitride is deposited on the buffer layer. Preferably, the buffer layer and a bulk mono-crystal of gallium-containing nitride deposited on the same consist essentially of gallium nitride.

In further embodiment of a substrate for epitaxy according to the present invention, a bulk mono-crystal of gallium-containing nitride is grown on a plurality of surfaces susceptible for lateral growth of gallium-containing nitride formed on a homo-seed or on a buffer layer on a hetero-seed, such surfaces being spaced apart from each other. When bulk mono-crystal of gallium-containing nitride is crystallized on a crystal seed thus processed, still further decrease of dislocation density of a bulk nitride mono-crystal of the present invention may be achieved.

According to the present invention a bulk mono-crystal of gallium-containing nitride crystallized on the seed crystal in form of a plate with two parallel planes essentially perpendicular to c-axis of hexagonal lattice of gallium-containing nitride is of a particular value from the point of view of further industrial applications. In this embodiment a bulk mono-crystal of gallium-containing nitride may be grown on all planes of such a seed crystal or a growth on selected planes of the seed may be realized.

When a bulk mono-crystal consisting essentially of gallium nitride is crystallized on a homo-seed crystal in form of a flat plate with two parallel faces perpendicular to c-axis of hexagonal lattice of gallium nitride, and bulk mono-crystals of GaN are grown on both such faces of the seed crystal, the resulting mono-crystals have different growth faces, one being nitrogen-terminated face and the other—gallium-terminated face. It has been noted that nitrogen-terminated face has a better crystalline quality than the gallium-terminated one. Generally, mono-crystal layer with nitrogen-terminated growth face has better overall properties than a layer with gallium-terminated growth face. In particular, the mono-crystal layer with nitrogen-terminated growth face has lower surface dislocation density than a layer with gallium-terminated growth face. Also the layer with nitrogen-terminated growth face has lower values of FWHM of the X-ray rocking curve than a layer with gallium-terminated growth face. The surface dislocation density on nitrogen-terminated growth face is close to $10^4/cm^2$ and at the same time the FWHM of the X-ray rocking curve is close to 60 arcsec.

In a preferred embodiment of a substrate for epitaxy according to the invention, a bulk mono-crystal of GaN is grown at the nitrogen-terminated face of the homo-seed, while growth of a bulk mono-crystal of GaN at gallium-terminated face is prevented. Prevention can be achieved by covering the gallium-terminated face of the seed by metallic plate made preferably of silver or by coating this face of the seed with a metallic layer, preferably made of silver, or else by arranging on the gallium-terminated face of the seed a second seed crystal of the same size with its gallium-terminated face facing the gallium-terminated face of the first seed.

Substrate for epitaxy of the present invention may be obtained by a method involving dissolution of a Group XIII elements feedstock in a supercritical solvent and crystallization of a gallium-containing nitride on a surface of seed crystal, with over-saturation of the supercritical solution with respect to gallium-containing nitride being reached by means of temperature and/or pressure variations. In a preferred embodiment it is obtained by a method involving dissolution of a gallium feedstock in a supercritical solvent and crystallization of a gallium nitride on a surface of seed crystal, at temperature higher and/or pressure lower than in the dissolution process.

Typically, the supercritical solvent contains $NH_3$ and/or its derivatives, and includes ions of elements of Group I—at least potassium or sodium ions, the feedstock consists essentially of gallium-containing nitride and/or its precursors, selected from a group including azides, imides, amido-imides, amides, hydrides, gallium-containing metal compounds and alloys, as well as metallic Group XIII elements especially metallic gallium.

In the process in which a bulk nitride mono-crystal of the present invention is obtained crystallization of gallium-containing nitride takes place in an autoclave, at temperatures ranging from 100° C. to 800° C. and at pressures from 10 MPa to 1000 MPa and a molar ratio of ions of elements of Group I to the remaining components of the supercritical solvent ranges from 1:200 to 1:2. As a source of alkali-metal ions alkali metals or alkali metal compounds, excluding those containing halogens, are used. The growth of a bulk mono-crystal of gallium-containing nitride is controlled by means of adjusting temperature and pressure of dissolution step and temperature and pressure of crystallization step. Crystallization step requires a temperature range of 400 to 600° C.

According to the present invention a bulk mono-crystal of gallium-containing nitride is crystallized in an autoclave with two separated zones—dissolution zone and crystallization zone, with a temperature difference between the two zones during crystallization not bigger than 150° C., preferably not bigger than 100° C. The control of over-saturation of supercritical solution with respect to gallium-containing nitride in the crystallization zone of the autoclave with two a.m. separated zones and a predetermined temperature difference between the two zones is achieved by controlling chemical (mass) transport between the two zones by means of use of a baffle or baffles separating the two zones and/or by means of using a feedstock material containing gallium in a form of gallium-containing nitride crystals having a total surface area bigger than a total surface area of seed crystals used.

Preferably, gallium-containing nitride consists essentially of gallium nitride.

A careful combination of the above discussed features leads to obtaining thick bulk mono-crystal of gallium-containing nitride. Depending on the size of an autoclave used thickness of the mono-crystal of 250 microns or bigger may be reached. In a particularly preferred embodiment a bulk gallium nitride mono-crystal having a cross-section in a plane perpendicular to c-axis of hexagonal lattice of gallium nitride a surface area greater than 100 $mm^2$, while its volume is sufficient to produce at least one further-processable non-polar A-plane or M-plane plate having a surface area at least 100 $mm^2$.

The bulk mono-crystal of gallium-containing nitride may include a seed crystal. In such a product at least one surface of a bulk mono-crystal of gallium-containing nitride is suitable for epitaxial growth of nitride semiconductor layers without any further pre-treatment.

As it was mentioned above, a bulk nitride mono-crystal of the present invention is obtained by a supercritical crystallization process, which includes at least two steps: a dissolution step at a first temperature and at a first pressure and a crystallization step at a second temperature and at a second pressure. Since generally high pressures and/or high temperatures are involved, the process is preferably conducted in an autoclave. The two steps (i.e. the dissolution step and the crystallization step) can either be conducted separately or can be conducted at least partially simultaneously in the same reactor.

For conducting the two steps separately, the process can be conducted in one reactor but the dissolution step is conducted before the crystallization step. In this embodiment the reactor can have the conventional construction of one single chamber. The process of the invention in the two-step embodiment can be conducted using constant pressure and two different temperatures or using constant temperature and two different pressures. It is also possible to use two different pressures and two different temperatures. The exact values of pressure and temperature should be selected depending on the feedstock, the specific nitride to be prepared and the solvent. Generally, the pressure is in the range of 10 to 1000 MPa, preferably 100 to 550, and more preferably 150 to 300 MPa. The temperature is in the range of 100 to 800° C., preferably 300 to 600° C., more preferably 400 to 550° C. If two different pressures are employed, the difference in pressure should range from 10 MPa to 900 MPa, preferably from 20 MPa to 300 MPa. However, if the dissolution and crystallization are controlled by the temperature, the difference in temperature should be at least 1° C., and preferably should range from 5° C. to 150° C.

Preferably, the dissolution step and the crystallization step are conducted—at least partially—simultaneously in the same autoclave. For such an embodiment pressure is practically uniform within the reaction vessel, while temperature difference between the dissolution zone and crystallization zone should be at least 1° C., and preferably from 5° C. to 150° C. Furthermore, the temperature difference between the dissolution zone and crystallization zone should be controlled so as to ensure a chemical transport in the supercritical solution, which takes place through convection in an autoclave.

In the present invention many materials containing Group XIII element(s), in particular gallium, which are soluble in the supercritical solvent under the conditions of the present invention, can be used as a feedstock. Typically, a gallium-containing feedstock will be a substance or mixture of substances, which contains at least gallium, and optionally alkali metals, other Group XIII element(s), nitrogen, and/or hydrogen, such as metallic elements of Group XIII, in particular Ga, alloys and inter-metallic compounds, hydrides, amides, imides, amido-imides, azides. Suitable gallium-containing feedstocks can be selected from the group consisting of gallium nitride—GaN, azides such as $Ga(N_3)_3$, imides such as $Ga_2(NH)_3$, amido-imides such as $Ga(NH)NH_2$, amides such as $Ga(NH_2)_3$, hydrides such as $GaH_3$, gallium-containing alloys, metallic gallium and mixtures thereof. Preferred feedstocks are metallic gallium and gallium nitride and mixtures thereof. Most preferably, the feedstock is metallic gallium or gallium nitride. If other elements of Group XIII are to be incorporated into the gallium-containing nitride crystal, corresponding compounds or mixed compounds including Ga and the other Group XIII element can be used. If the substrate is to contain dopants or other additives, precursors thereof can be added to the feedstock.

The form of the feedstock is not particularly crucial and it can be in the form of one or more pieces or in the form of a powder. If the feedstock is in the form of powder, care should be taken that individual powder particles are not transported from the dissolution zone to the crystallization zone, where they can cause uncontrolled crystallization. It is preferable that the feedstock is in form of one or more pieces and that the surface area of the feedstock is larger than that of the crystallization seed.

The nitrogen-containing solvent employed in the present invention must be able to form a supercritical fluid, in which gallium can be dissolved in the presence of alkali metal ions. Preferably the solvent is ammonia, a derivative thereof or mixtures thereof. A suitable example of ammonia derivative is hydrazine. Most preferably the solvent is ammonia. To reduce corrosion of the reactor and to avoid side-reactions, halogens e.g. in the form of halides are preferably not intentionally added into the reactor. Although traces of halogens may be introduced into the system in the form of unavoidable impurities of the starting materials, care should be taken to keep the amount of halogen as low as possible. Due to the use of a nitrogen-containing solvent such as ammonia it is not necessary to include nitride compounds into the feedstock.

Gallium nitride exhibits good solubility in supercritical $NH_3$, provided it contains alkali metals or their compounds, such as $KNH_2$. The graph in FIG. 1 presents solubility of GaN in supercritical solvent depending on pressure, for temperatures 400 and 500° C., defined as a molar percentage: $S_m$=[$GaN^{solution}$: ($KNH_2+NH_3$)]×100%. In this example $KNH_2$ in supercritical ammonia is used as a solvent and a molar ratio x≡$KNH_2$: $NH_3$ is equal to 0.07. In this case $S_m$ should be a smooth function of only three parameters: temperature, pressure, and molar ratio of mineralizer (i.e. $S_m=S_m(T, p, x)$). Small changes of Sm can be expressed as:

$$\Delta S_m \approx (\partial S_m/\partial T)|_{p,x} \Delta T + (\partial S_m/\partial p)|_{T,x} \Delta p + (\partial S_m/\partial x)|_{T,p} \Delta x,$$

where the partial differentials (e.g. $(\partial S_m/\partial T)|_{p,x}$) determine the behavior of $S_m$ with variation of its parameters (e.g. T). In this specification the partial differentials are called "coefficients" (e.g. $(\partial S_m/\partial T)|_{p,x}$ is a "temperature coefficient of solubility"). The graph shows that solubility increases with pressure and decreases with temperature. On the basis of the dependences it is possible to optimize parameters of bulk mono-crystalline gallium-containing nitride obtained by dissolving it under higher solubility conditions and crystallization under lower solubility conditions.

Figure 2:
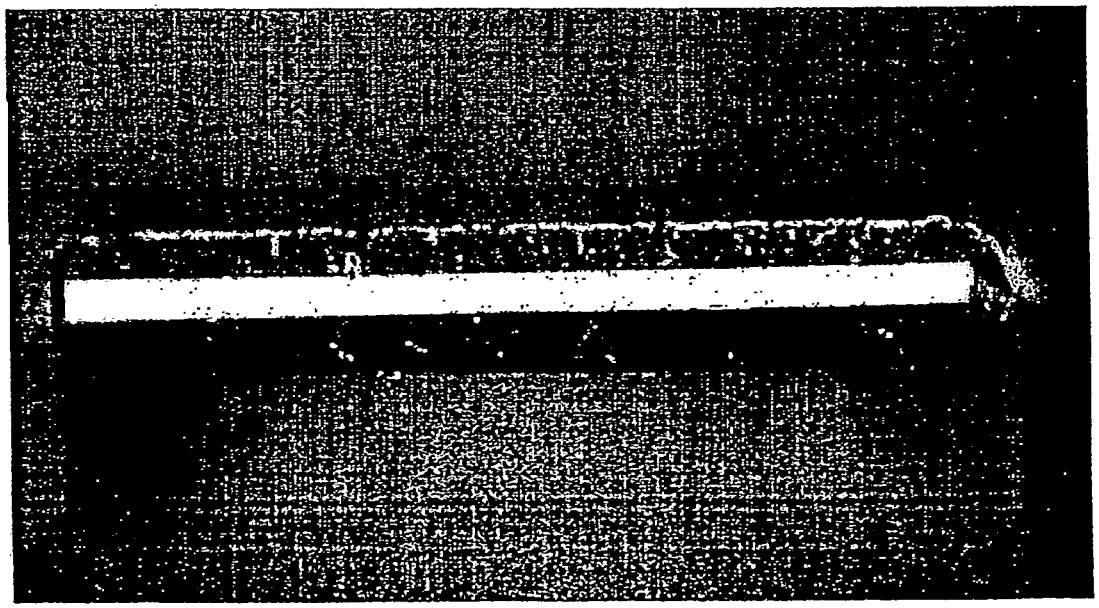
FIG. 2 shows florescence microscope view of a fracture of a substrate for epitaxy according to the invention.
Figure 3A:
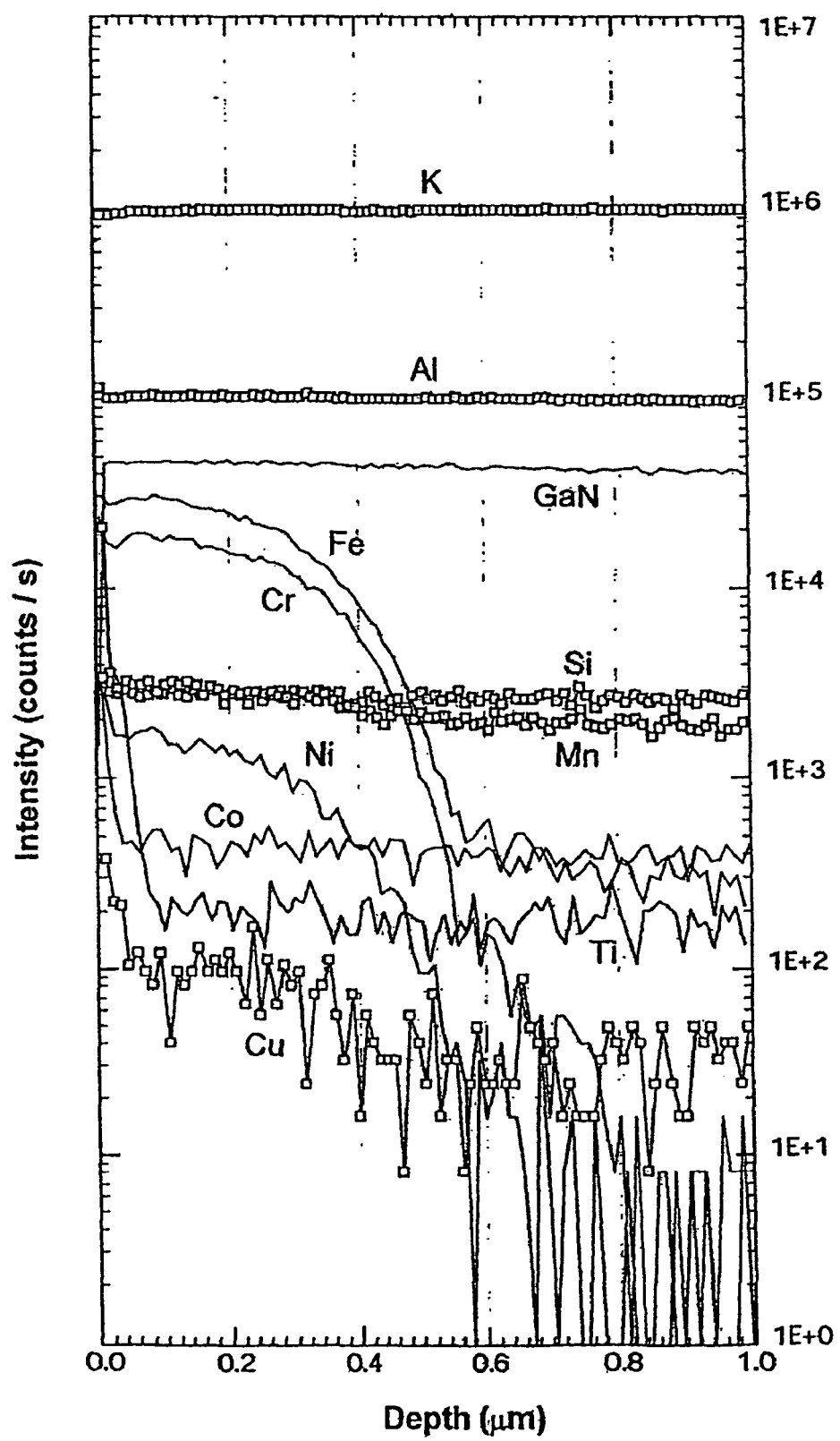
Figure 3B:
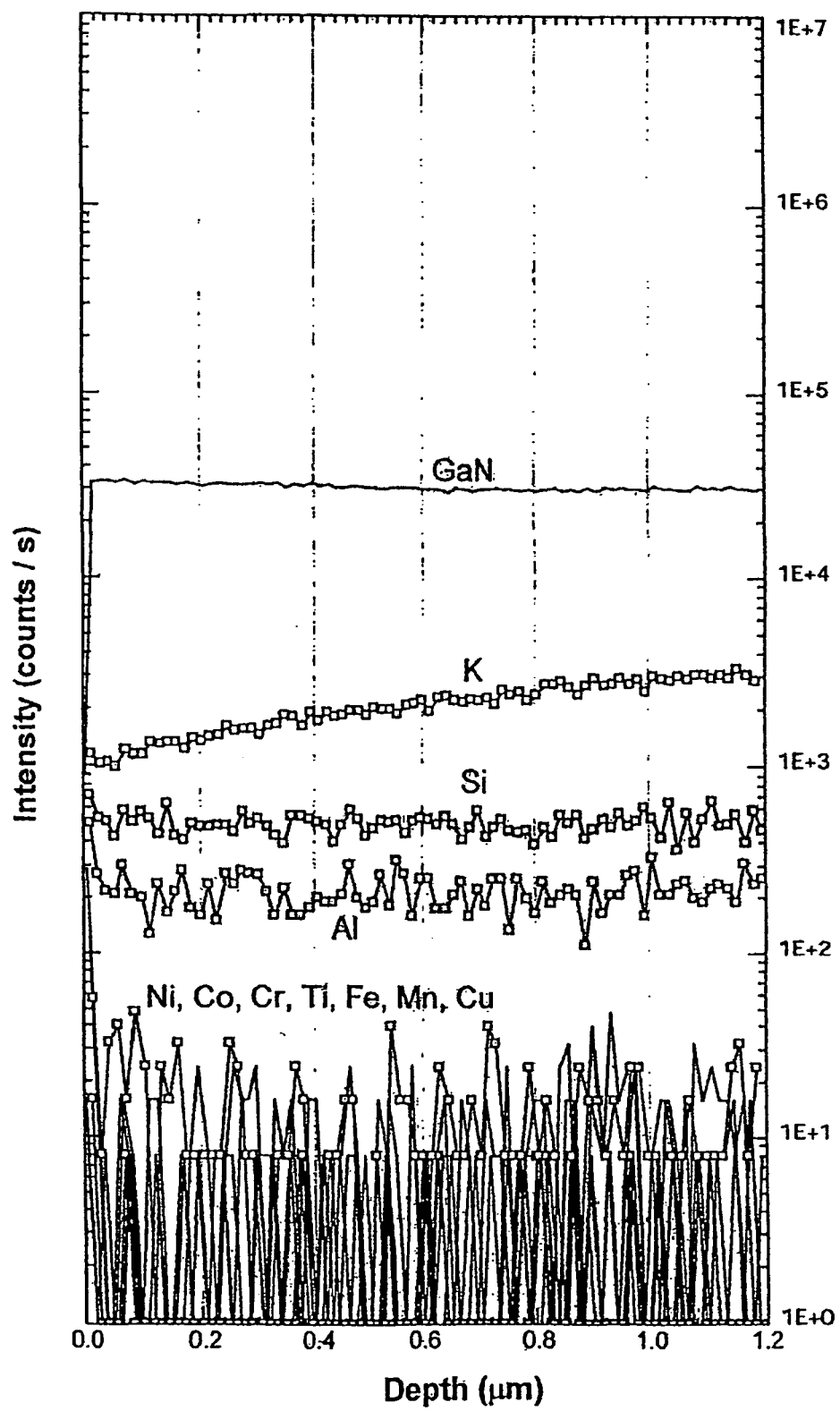
FIG. 3b shows for comparison SIMS profiles of a sample of gallium nitride obtained by HVPE method and having a very low content of Group I metals.
Figure 4:
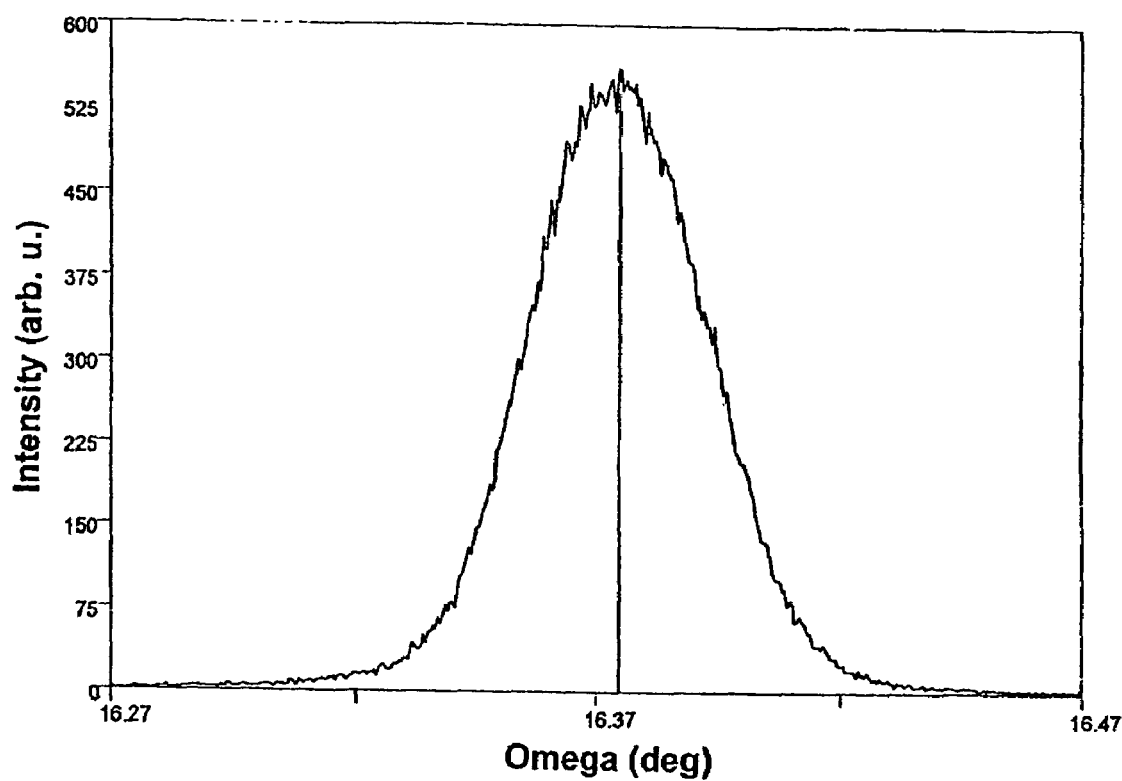
FIG. 4 presents an X-ray rocking curve from (0002) plane of the bulk GaN mono-crystal according to the invention.

It has turned out that also other gallium compounds and even metallic gallium may become sources of gallium ammonia complexes. For example, gallium complexes could be introduced into a solvent having the above composition starting with the simplest substrate, i.e. metallic gallium. By means of appropriate change in conditions (e.g. increase in temperature) formation of a gallium-nitride over-saturated solution is obtained and crystallization on seed occurs. The above discussed method allows growth of a bulk mono-crystals of gallium nitride on seeds and leads in particular to formation of stoichiometric gallium nitride in the form of a bulk mono-crystal of gallium nitride on the gallium-nitride seed crystal. FIG. 2 in the drawing shows a microscopic view of a cross-section of one of the obtained samples of crystal seed with two bulk nitride mono-crystals according to the invention. In that sample a crystal seed obtained by HVPE method and having a thickness of ca. 100 μm was used. GaN layers crystallized on both sides of the seed were 250 μm thick, in total. The brightness of the internal seed layer is caused by a so-called yellow luminescence typical for GaN and most probably caused by radiation processes involving native defects of a crystal, such as for example nitrogen vacancies. In the crystallized bulk mono-crystal of GaN there is no yellow-luminescence effect, and therefore they can be easily distinguished from the seed crystal under fluorescence microscope. Lack of yellow luminescence effect may result from a low level of native defects in a substrate according to the invention or from a high number of non-radiation centers in the bulk mono-crystal of GaN obtained. The latter explanation is probable in view of a presence of impurities such as transition elements such as Ni, Co, Cr, and Ti originating from the reaction environment.

The solubility of feedstock, namely gallium and corresponding elements of Group XIII and/or their compounds, can be significantly improved by the presence of at least one type of alkali metal-containing component as a solubilization aid ("mineralizer"). Lithium, sodium and potassium are preferred as alkali metals, wherein sodium and potassium are more preferred. The mineralizer can be added to the supercritical solvent in elemental form or preferably in the form of alkali metal compound. Generally the choice of the mineralizer depends on the solvent employed in the process. According to our investigations, alkali metal having a smaller ion radius can provide lower solubility of gallium-containing nitride in the supercritical ammonia solvent than that obtained with alkali metals having a larger ion radius. For example, if the mineralizer is in the form of a compound, it is preferably an alkali metal hydride such as MH, an alkali metal nitride such as $M_3N$, an alkali metal amide such as $MNH_2$, an alkali metal imide such as $M_2NH$ or an alkali metal azide such as $MN_3$ (wherein M is an alkali metal). The concentration of the mineralizer is not particularly restricted and is selected so as to ensure adequate levels of solubility of feedstock (the starting material), crystallization seed and gallium-containing nitride (the resulting product). It is usually in the range of 1:200 to 1:2, in the terms of the moles of the metal ion based on the moles of the solvent (molar ratio). In a preferred embodiment the concentration is from 1:100 to 1:5, more preferably 1:20 to 1:8 moles of the metal ion based on the moles of the solvent.

The presence of the alkali metal in the process can lead to the presence of alkali-metal elements in the thus prepared nitride mono-crystals. It is possible that the amount of alkali metal elements is more than about 0.1 ppm, even more than 10 ppm. However, in these amounts the alkali metals do not detrimentally effect the properties of the mono-crystals. It has been found that even at an alkali metal content of 500 ppm, the operational parameters of a nitride bulk mono-crystal according to the invention when used as a substrate for epitaxy are still satisfactory.

The dissolved feedstock crystallizes in the crystallization step under the low solubility conditions on the crystallization seed(s) which are provided in the autoclave.

Due to the good crystalline quality, the obtained bulk mono-crystals of gallium-containing nitride of the present invention may be used as substrates for opto-electronic semiconductor devices based on nitrides, in particular for laser diodes.

The following examples are intended to illustrate the invention and should not be construed as being limiting.

EXAMPLE 1

Figure 5:
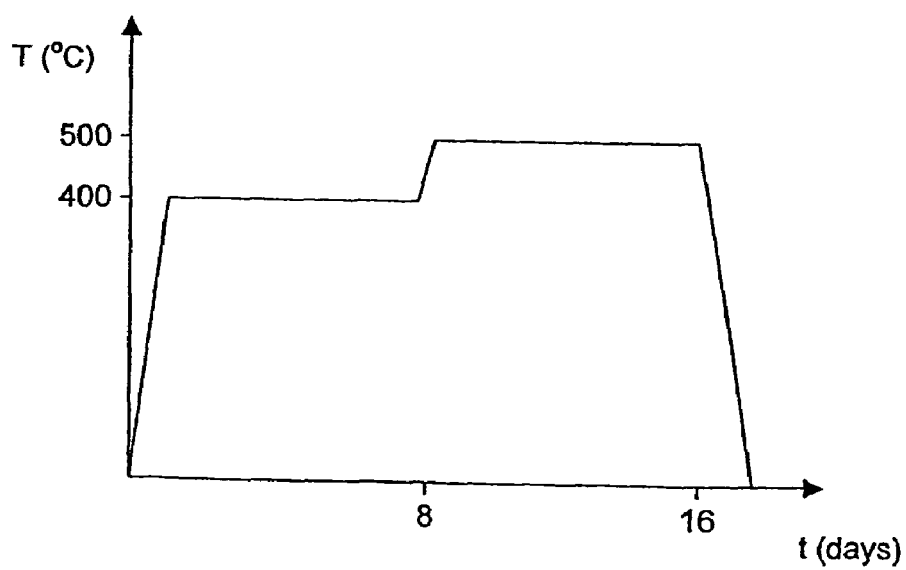
FIG. 5 shows change of temperature inside the autoclave in time at a constant pressure in Example 1.

Two crucibles were introduced into the high pressure 10.9 $cm^3$ autoclave built on the basis of a known design solution [H. Jacobs, D. Schmidt, *Current Topics in Materials Science*, vol. 8, ed. E. Kaldis (North-Holland, Amsterdam, 1981), 381], one containing 0.4 g feedstock comprising gallium nitride in the form of 0.1 mm thick strips obtained using the HVPE method, second containing a 0.1 g seed crystals with double thickness, also obtained using the HVPE method. 0.72 g 4N purity metallic potassium was introduced into the autoclave. The autoclave was filled with 4.82 g ammonia, and closed. The autoclave was introduced into the oven and heated to 400° C. Pressure inside the autoclave was 200 MPa. The temperature was increased to 500° C. after 8 days, with pressure maintained at 200 MPa. The autoclave was kept under such conditions for another 8 days (graph in FIG. 5). The process led to total dissolution of the feedstock and recrystallization of the gallium nitride layer on the partly dissolved seed crystal.

EXAMPLE 2

Figure 6:
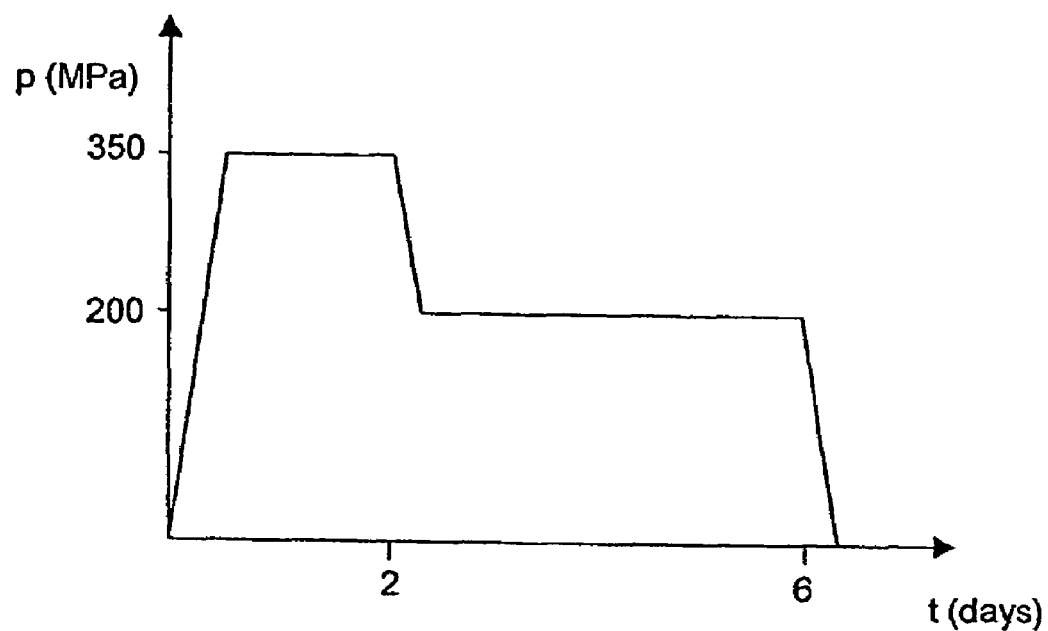
FIG. 6 presents change of pressure in time inside the autoclave at constant temperature in Example 2.

Two crucibles were introduced into the 10.9 cm$^3$ high-pressure autoclave, one containing 0.44 g gallium nitride feedstock in the form of 0.1 mm strips obtained using the HVPE method, second containing 0.1 g seed crystals with double thickness, also obtained using the HVPE method. 0.82 g 4N purity metallic potassium was introduced into the autoclave. The autoclave was filled with 5.43 g ammonia, and closed. The autoclave was introduced into the oven and heated to 500° C. Pressure inside the autoclave was 350 MPa. After 2 days, the pressure was decreased to 200 MPa, and temperature was maintained at 500° C. and the autoclave was kept under these conditions for a further period of 4 days (graph in FIG. 6). The process led to total dissolution of the feedstock and recrystallization of the gallium nitride layer on the partly dissolved seed crystals.

EXAMPLE 3

Figure 7:
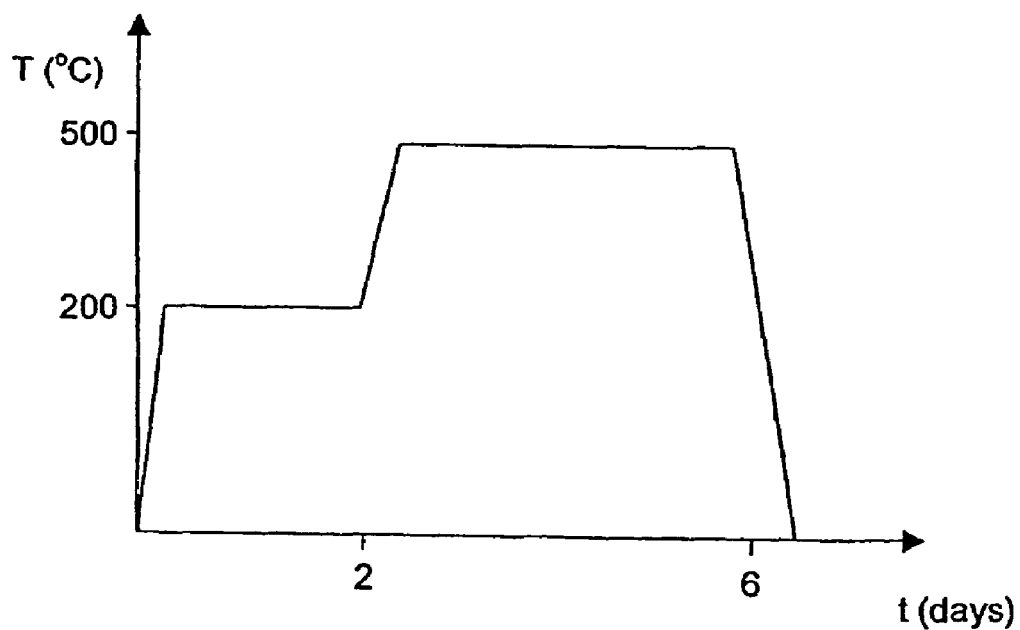
FIG. 7 presents change of temperature in time in the autoclave at constant volume in Example 3.

Two crucibles were introduced into the 10.9 cm$^3$ high-pressure autoclave, one containing 0.3 feedstock in the form of 6N purity metallic gallium, second containing 0.1 g seed crystals obtained using the HVPE method. 0.6 g 4N purity metallic potassium was introduced into the autoclave. The autoclave was filled with 4 g ammonia, and closed. The autoclave was introduced into the oven and heated to 200° C. The temperature was increased after 2 days to 500° C., maintaining pressure at 200 MPa. The autoclave was kept under these conditions for a further period of 4 days (graph in FIG. 7). The process led to total dissolution of the feedstock and recrystallization of the gallium nitride layer on the seed crystals.

EXAMPLE 4

Figure 8:
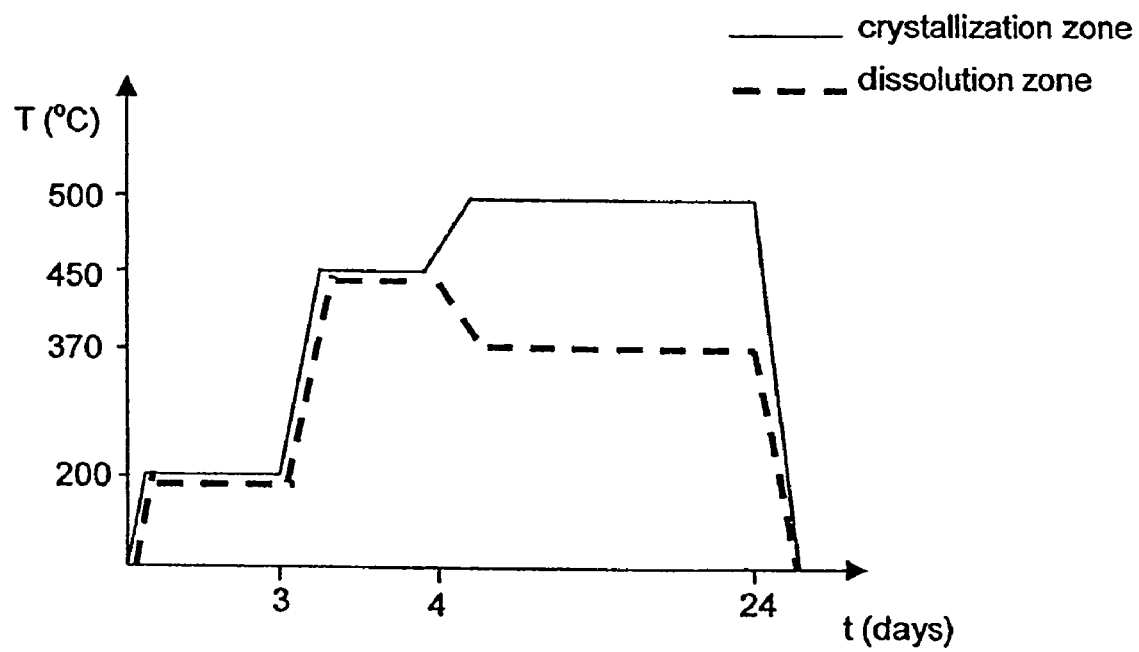
FIG. 8 presents change of temperature in time for Example 4.

1.0 g gallium nitride obtained using the HVPE method was placed as feedstock in the dissolving zone of a 35.6 cm$^3$ high-pressure autoclave, while in crystallization zone of the autoclave a seed crystal of gallium nitride obtained using the HVPE method, having a thickness of 100 μm and surface area of 2.5 cm$^2$ was placed Next, the autoclave was charged with 1.2 g of metallic gallium 6N pure and 2.2 g of metallic potassium 4N pure. Subsequently the autoclave was filled with 15.9 g ammonia (5N), closed, introduced into an oven and heated to 200° C. After 3 days—during which period metallic gallium was dissolved forming gallium complexes in the supercritical solution, the temperature was increased to 450° C. A pressure inside the autoclave was at that temperature about 230 MPa. After further one day, the high-temperature crystallization zone temperature was increased to 500° C. and temperature of the low-temperature dissolution zone was decreased to about 370° C. and the autoclave was maintained under those conditions for the next 20 days (graph in FIG. 8). As a result of the process, partial dissolution of the gallium nitride feedstock took place in the low-temperature zone and growth of gallium nitride in form of a mono-crystal layer of 350 μm thickness on gallium nitride seed crystals—in the high-temperature zone.

EXAMPLE 5

Figure 9:
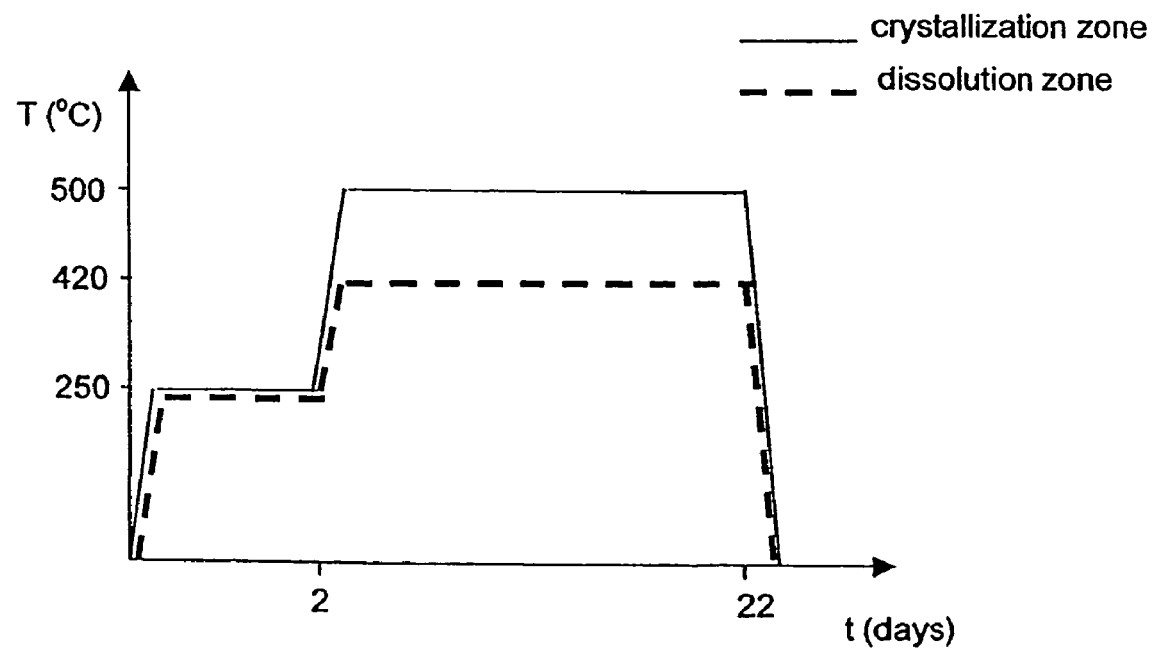
FIG. 9 presents change of temperature in time for Example 5.

A 3.0 g sintered gallium nitride tablet was placed in low-temperature dissolution zone of the 35.6 cm$^3$ high-pressure autoclave and gallium nitride seed crystal obtained by using the HVPE method, having a thickness of 120 μm and surface area of 2.2 cm$^2$ was placed in the high-temperature crystallization zone of the same autoclave, and 2.3 g 4N purity metallic potassium was introduced. Next, the autoclave was filled with 15.9 g (5N) ammonia and closed. Autoclave was then introduced into the oven and heated to about 250° C. in order to partially dissolve a sintered GaN tablet and reach a saturation of supercritical solution with gallium complexes After two days, the temperature of the high-temperature crystallization zone was increased to 500° C., and temperature of the low-temperature dissolution zone was decreased to 420° C. and the autoclave was maintained under those conditions for the next 20 days (graph in FIG. 9). In result of the process, substantial dissolution of the gallium nitride feedstock took place in the low-temperature dissolution zone and in the high-temperature crystallization zone growth of gallium nitride on gallium nitride seed crystals took place in a form of layers having a total thickness of about 500 μm.

EXAMPLE 6

Figure 10:
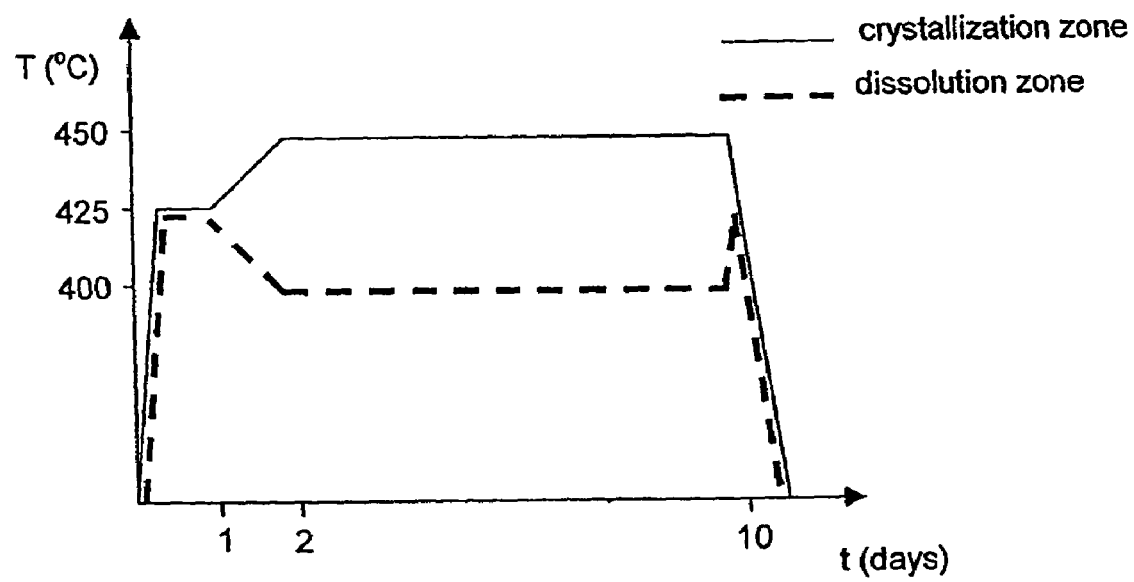
FIG. 10 presents change of temperature in time for Example 6.

1.6 g gallium nitride obtained using the HVPE method was placed in low-temperature zone of the 35.6 cm$^3$ high-pressure autoclave, 0.8 g gallium nitride seed crystals obtained also using the HVPE method were placed in the high-temperature zone, and 3.56 g 4N purity metallic potassium was introduced. Next, the autoclave was filled with 14.5 g (5N) ammonia and closed. Autoclave was then introduced into the oven and heated to about 425° C. Pressure inside the autoclave was about 150 MPa. After one day, temperature of the high-temperature zone was increased to 450° C., and temperature of the low-temperature zone was decreased to 400° C. and the autoclave was maintained under those conditions for the next 8 days (graph in FIG. 10). In result of the process, partial dissolution of the gallium nitride feedstock took place in the low-temperature zone and growth of gallium nitride on the HVPE gallium nitride seed crystals took place in the high-temperature zone.

EXAMPLE 7

Figure 11:
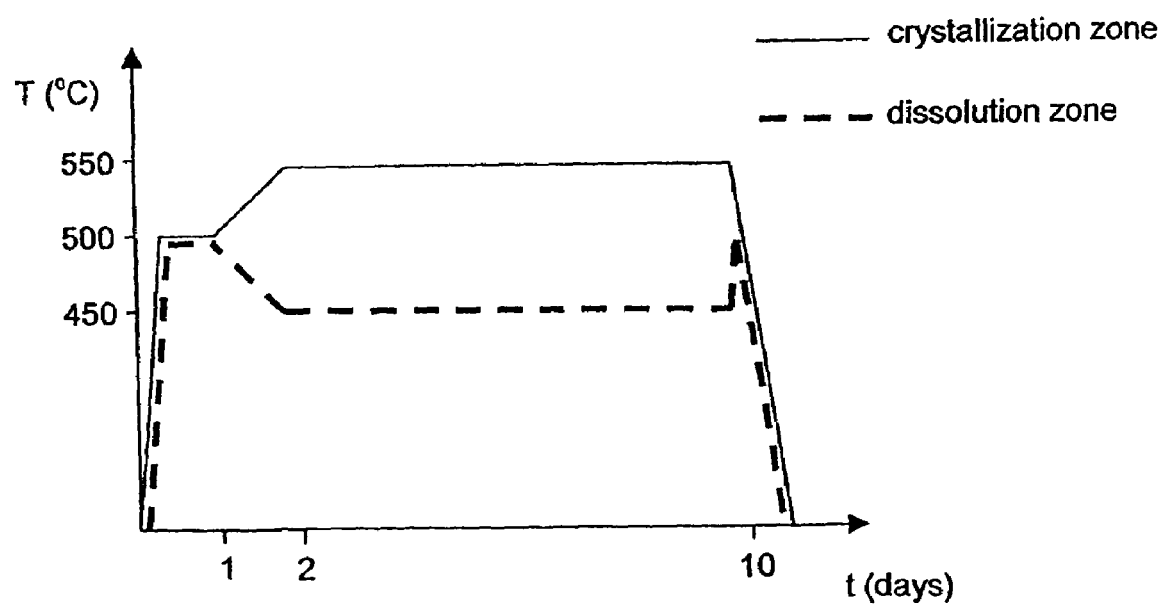
FIGS. 11 to 15 present change of temperature in time for Example 7 to 11.

2 g gallium nitride obtained using the HVPE method was placed in low-temperature zone of the 35.6 cm$^3$ high-pressure autoclave, and 0.47 g 4N purity metallic potassium was introduced, while 0.7 g gallium nitride seed crystals also obtained by using the HVPE method were placed in the high-temperature zone. Next, the autoclave was filled with 16.5 g (5N) ammonia and closed. Autoclave was then introduced into the oven and heated to 500° C. Pressure inside the autoclave was about 300 MPa. After one day, temperature of the high-temperature zone was increased to 550° C., and temperature of the low-temperature zone was decreased to 450° C. and the autoclave was maintained under those conditions for the next 8 days (graph in FIG. 11). In result of the process, partial dissolution of the gallium nitride feedstock took place in the low-temperature zone and growth of gallium nitride on the gallium nitride seed crystals occurred in the high-temperature zone.

EXAMPLE 8

(Doping GaN with Mg)

Figure 12:
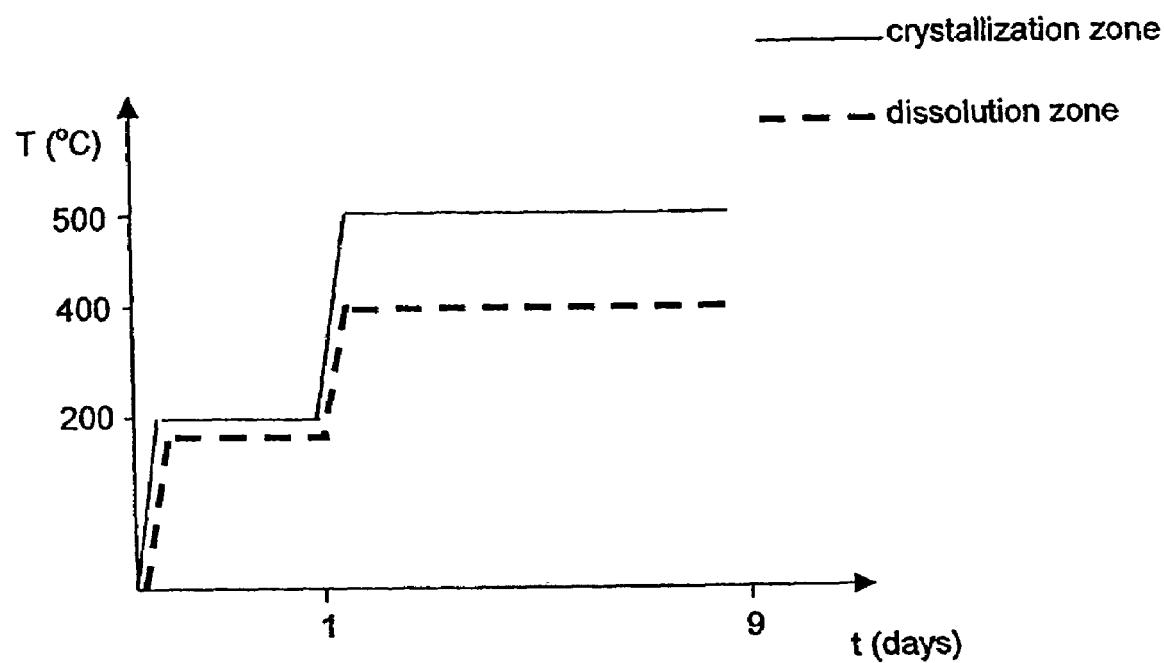

An amount of 0.5 g of gallium nitride crystals of average thickness of about 120 micron, produced by the HVPE method, was placed into the low-temperature dissolution zone of the high-pressure autoclave of 35.6 cm$^3$ capacity. In the high-temperature crystallization zone of the autoclave, three seed crystals of gallium nitride obtained by the HVPE method were placed. The seed crystals had a thickness of 120 micron and total surface area of 1.0 cm$^2$. Then the autoclave was charged with 0.07 g of metallic gallium, 1.36 g of metallic sodium of 3N purity, and 0.01 g of metallic magnesium which played the role of acceptor dopant. Subsequently, the autoclave was filled with 15.4 g of ammonia (5N), closed, put into a furnaces and heated to temperature of 200° C. After 1 day—during which period metallic gallium was reacted to form gallium in the soluble form in the supercritical solution—the autoclave was heated so that temperature in the crystallization zone was increased to 500° C., while temperature in the dissolution zone was increased to 400° C. The resulting pressure was about 230 MPa. The autoclave was kept in these conditions for the next 8 days (graph in FIG. 12). As a result of this process, partial dissolution of material in the dissolution zone and growth of gallium nitride on gallium-nitride seeds in the crystallization zone took place. The resulting crystals of gallium nitride were in the form of two-sided mono-crystalline layers having a total thickness of 450 microns. The doping was effective in the layer grown on N-terminated face of GaN seed. That layer had a thickness of about 270 microns. Its cathodoluminescence spectrum at room temperature had a broad peak with a maximum at about 2.9 eV (blue). The presence of magnesium was also confirmed by SIMS measurement at the level of $10^{18}/cm^3$.

EXAMPLE 9

Figure 13:
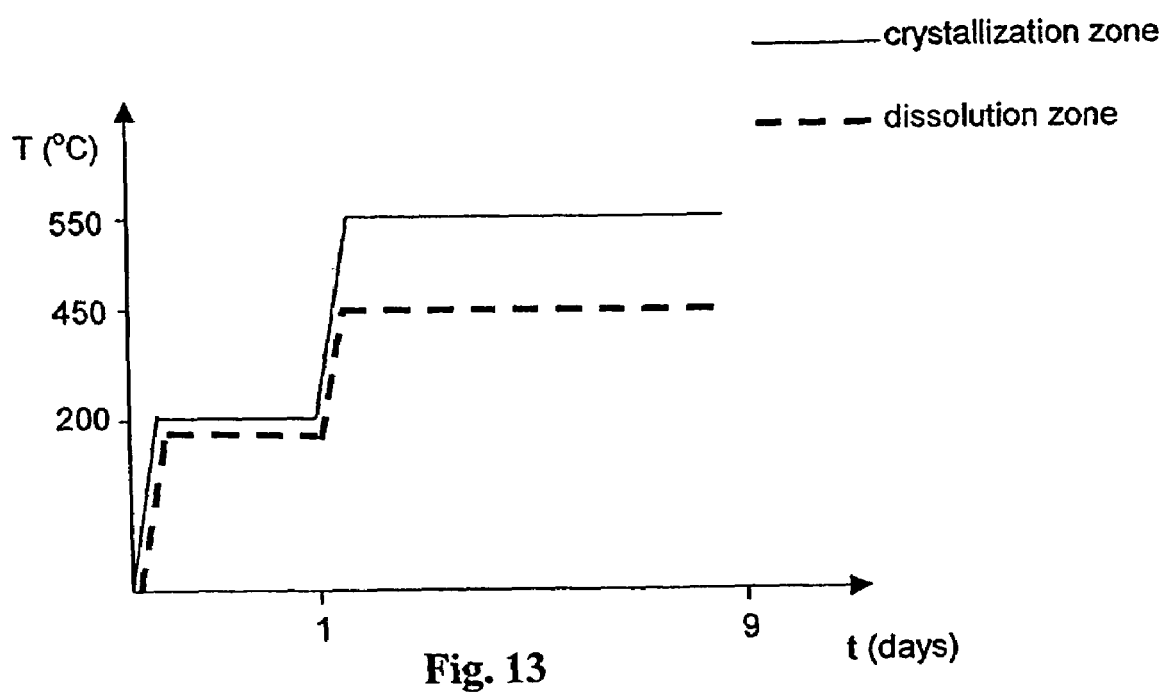

An amount of 2.0 g of gallium nitride crystals of average thickness of about 150 micron, produced by the HVPE method, was placed into the low-temperature dissolution zone of the high-pressure autoclave of 90 cm$^3$ capacity. In the high-temperature crystallization zone of the autoclave, three seed crystals of gallium nitride obtained by the HVPE method were placed. The seeds had initial thickness of 600 micron, but were carefully polished from both sides. After such polishing the seed crystals had a thickness of 250 micron and total surface area of 1.7 cm$^2$. Then the autoclave was charged with 0.27 g of metallic gallium and 3.43 g of metallic sodium of 3N purity. Subsequently, the autoclave was filled with 38.8 g of ammonia (5N), closed, put into a furnaces and heated to temperature of 200° C. After 1 day—during which period metallic gallium was reacted to form gallium in the soluble form in the supercritical solution—the autoclave was heated so that temperature in the crystallization zone was increased to 550° C., while temperature in the dissolution zone was increased to 450° C. The resulting pressure was about 260 MPa. The autoclave was kept in these conditions for the next 8 days (graph in FIG. 13). As a result of this process, partial dissolution of material in the dissolution zone and growth of gallium nitride on gallium-nitride seeds in the crystallization zone took place. The resulting crystals of gallium nitride were in the form of two-sided mono-crystalline layers having a total thickness of 500 microns. The layer grown at N-terminated side had good crystalline quality: the FWHM of X-ray rocking curve from (0002) plane was 66 arcsec and the dislocation density calculated from the cathodoluminescence map was $6 \times 10^4/cm^2$.

EXAMPLE 10

(Preparation of AlGaN)

Figure 14:
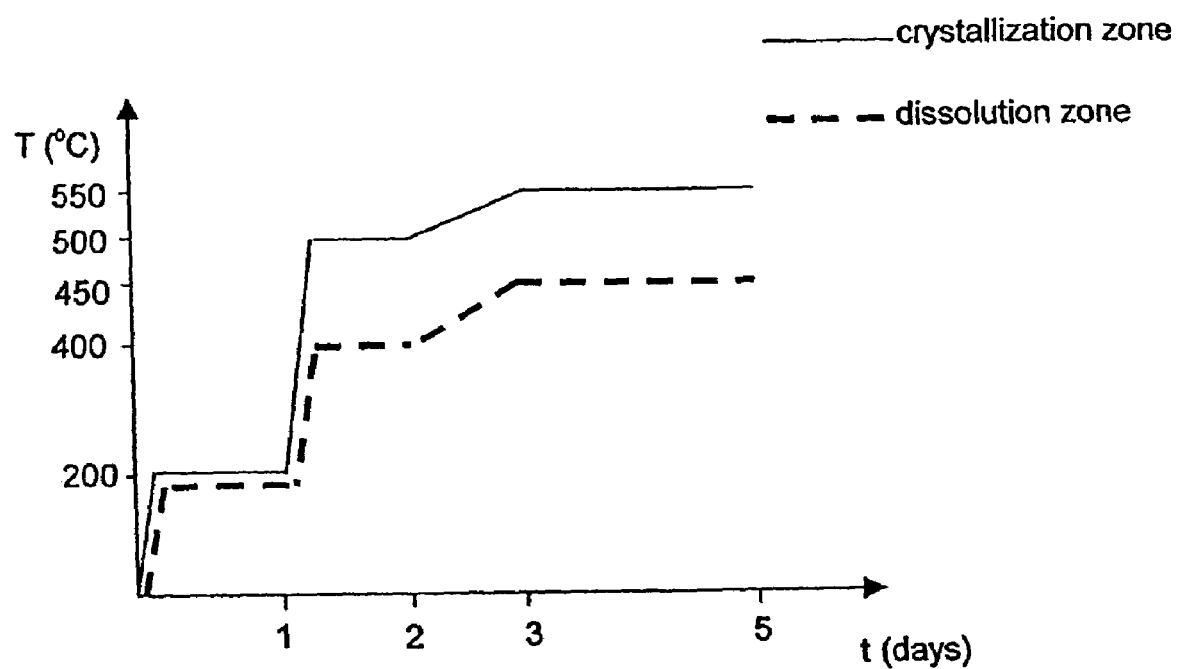

An amount of 0.2 g of microcrystalline aluminum nitride in the form of one sintered pellet, was placed into the low-temperature dissolution zone of the high-pressure autoclave of 36.2 cm$^3$ capacity. In the high-temperature crystallization zone of the autoclave, two seed crystals of gallium nitride obtained by the HVPE method were placed. The seed crystals had a thickness of 120 micron and total surface area of 1.1 cm$^2$. Then the autoclave was charged with 0.12 g of metallic gallium and 1.39 g of metallic sodium of 3N purity. Subsequently, the autoclave was filled with 15.7 g of ammonia (5N), closed, put into a furnaces and heated to temperature of 200° C. After 1 day—during which period metallic gallium was reacted to form gallium in the soluble form in the supercritical solution—the autoclave was heated so that temperature in the crystallization zone was increased to 500° C., while temperature in the dissolution zone was increased to 400° C. The resulting pressure was about 230 MPa. The autoclave was kept in these conditions for 1 day, then the temperatures of dissolution and crystallization zones were increased during 1 day by 50° C., and the autoclave was maintained in these conditions for another 2 days (graph in FIG. 14). As a result of this process, partial dissolution of A/N in the dissolution zone and growth of $Al_{0.2}Ga_{0.8}N$ on gallium-nitride seeds in the crystallization zone took place. The resulting crystals of $Al_{0.2}Ga_{0.8}N$ were in the form of two-sided mono-crystalline layers having a total thickness of 10 microns. The Al content was determined by X-ray diffraction measurement, as well as EDX measurement. Both techniques yielded consistent Al content at the level of 20 at. % (in cation sublattice).

EXAMPLE 11

Figure 15:
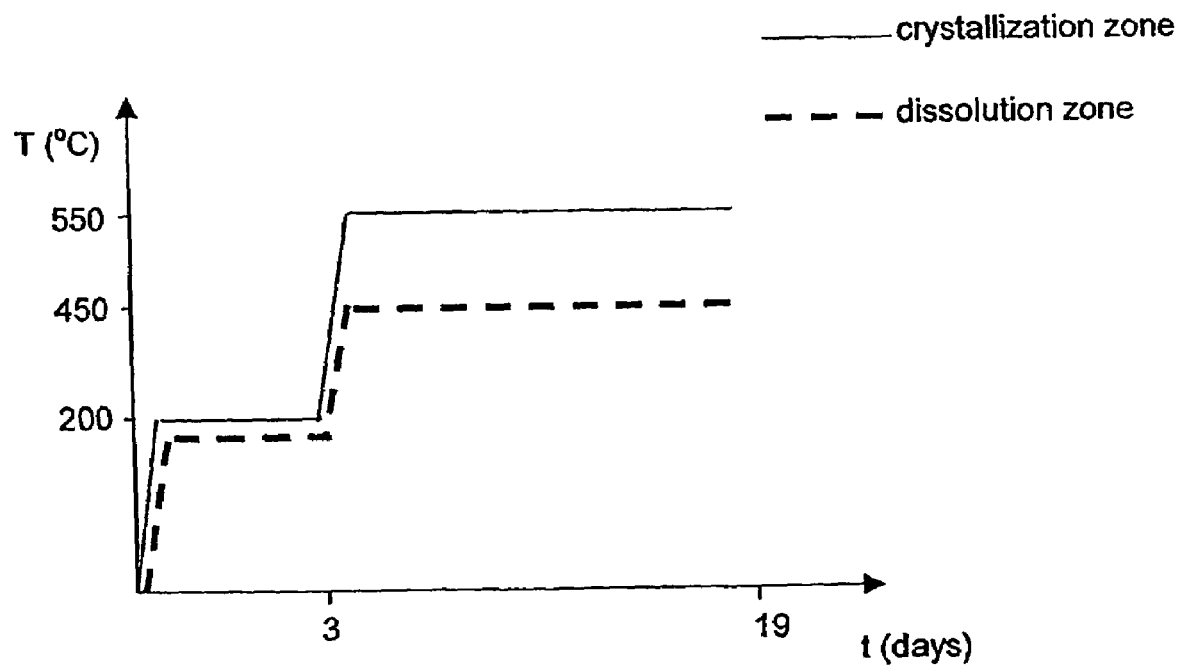

An amount of 20 g of low-crystalline-quality gallium nitride of average thickness of about 250 micron, grown by the method according to the invention on HVPE 100 micron plates, was placed into the low-temperature dissolution zone of the high-pressure autoclave of 4 cm diameter, 48 cm length, and 600 cm$^3$ total capacity. In the high-temperature crystallization zone of the autoclave, twenty seed crystals of gallium nitride obtained by the HVPE method were placed. The seeds had initial thickness of 600 micron, but were carefully polished from both sides. After such polishing, the seed crystals had a thickness of 250 micron and total surface area of 25 cm$^2$. Then the autoclave was charged with 1.9 g of metallic gallium and 22.6 g of metallic sodium of 3N purity. Subsequently, the autoclave was filled with 256 g of ammonia (5N), closed, put into a furnaces and heated to temperature of 200° C. After 3 days—during which period metallic gallium was reacted to form gallium in the soluble form in the supercritical solution—the autoclave was heated so that temperature in the crystallization zone was increased to 550° C., while temperature in the dissolution zone was increased to 450° C. The resulting pressure was about 260 MPa. The autoclave was kept in these conditions for the next 16 days (graph in FIG. 15). As a result of this process, partial dissolution of material in the dissolution zone and growth of gallium nitride on gallium-nitride seeds in the crystallization zone took place. The resulting crystals of gallium nitride were in the form of two-sided mono-crystalline layers having a total thickness of 1000 microns.

EXAMPLES 12-19

Procedures as described in Examples 1-7 and 9 have been repeated except that gallium-terminated faces of crystal seeds, have been covered by a metallic plate made of silver, before placing them in the high-temperature zone of the autoclave. Similar results were obtained, however it has been confirmed that growth of GaN on gallium-terminated face of the seeds has been prevented by a presence of metallic plate in all experiments, and that bulk mono-crystals of GaN deposited on nitrogen-terminated faces of the seed crystals of the best quality were obtained in Example 19 carried out in accordance with the procedure described in details in Example 9.

EXAMPLE 20

Procedure as described in Example 19 (with the best quality of bulk mono-crystal of GaN deposited on nitrogen-terminated face of the seed crystal mentioned in previous paragraph) has been repeated except that gallium-terminated faces of crystal seeds, have been coated by metallic layer made of silver, before placing them in the high-temperature zone of the autoclave. Similar results were obtained, since growth of GaN on gallium-terminated face of the seeds has also been prevented by a presence of metallic layer and a bulk mono-crystal of GaN deposited on nitrogen-terminated faces of the seed crystals were of good quality.

EXAMPLE 21

Procedure as described in Example 20 has been repeated except that on the gallium-terminated face of each seed crystal a second seed crystal of the same size has been arranged with its gallium-terminated face facing the gallium-terminated face of the first seed crystal, before placing them in the high-temperature zone of the autoclave. Similar results were obtained, since growth of GaN on gallium-terminated faces of each individual seed has been prevented by a presence a second seed crystal and a bulk mono-crystal of GaN deposited on nitrogen-terminated faces of the seed crystals were of good quality. Actually, each pair of seed crystals used has formed a single flat piece of GaN with nitrogen-terminated faces on both sides of the same.

EXAMPLE 22

In this example a bulk mono-crystal of GaN has been formed on a primary substrate as illustrated in FIG. 17, showing a cross-section of the obtained substrate for epitaxy.

A primary substrate has been used which has been formed as follows:

On a sapphire plate 1 having a flat surface perpendicular to the C axis a buffer layer 2 was deposited at the 500° C. using hydrogen as a gaseous carrier and ammonia and TGM (trimethyl gallium) as gaseous reagents and thereafter in a standard growth temperature a nitride semiconductor layer 3 was deposited by MOCVD method. The nitride semiconductor layer 3 is typically a n-type semiconductor (FIG. 17-A). Thickness of the buffer layer 2 should be within a range of 50 to 500 Å. There is no limit of thickness of nitride semiconductor layer 3 other than that impaired by MOCVD method used for depositing the same.

Next, the nitride semiconductor layer 3 was etched in order to obtain a surface having a striped structure with parallel stripes 5 (FIG. 17-B). In order to avoid a reaction of the sapphire plate 1 with the supercritical solution containing ammonia and to keep the supercritical solution in the unpolluted condition so that the quality of the bulk mono-crystal of GaN is not adversely affected, free surfaces of sapphire plate 1 are covered by mask layer 4. Such mask layer 4 is made of a material insoluble in the supercritical solution or of a material which—when dissolved in supercritical solution—does not introduce any polluting species. Silver—Ag, is a suitable material for forming the mask layer 4.

The primary substrate prepared as described above was placed in the high-temperature zone of the same autoclave as used in Examples 1-10, 12-21 and a bulk mono-crystal of GaN was deposited under the same conditions as in Example 9. It has turned out that lateral overgrowth has dominated and on a primary substrate 3 as shown in FIG. 17-B constituting a seed crystal, during a 70 hours process, a nitride layer 7 was deposited in form of a bulk mono-crystal of GaN (FIG. 17-D). The deposited GaN layer 7 was more than 1 µm thick. Its thickness was nearly 300 µm.

EXAMPLE 23

Procedure as described in Example 22 was repeated except that different primary substrate was used as seed-crystal.

On sapphire plate 1—after depositing the buffer layer 2—a nitride semiconductor layer 3 was formed by HVPE. The layer was more than 30 µm thick. Next, on a surface of the nitride layer 3 stripes 5 were formed and the sapphire plate 1 was removed.

The thus prepared primary substrate was placed in the high-temperature zone of the autoclave and the mono-crystalline nitride layer 7 was formed by lateral overgrowth.

In the same run, another primary substrate with a mask layer deposited on part of a surface of nitride layer 3 was also placed in the high-temperature zone of the autoclave and similar results were obtained.

EXAMPLE 24

Semiconductor UV Laser Diode/GaN Substrate

Figure 19:
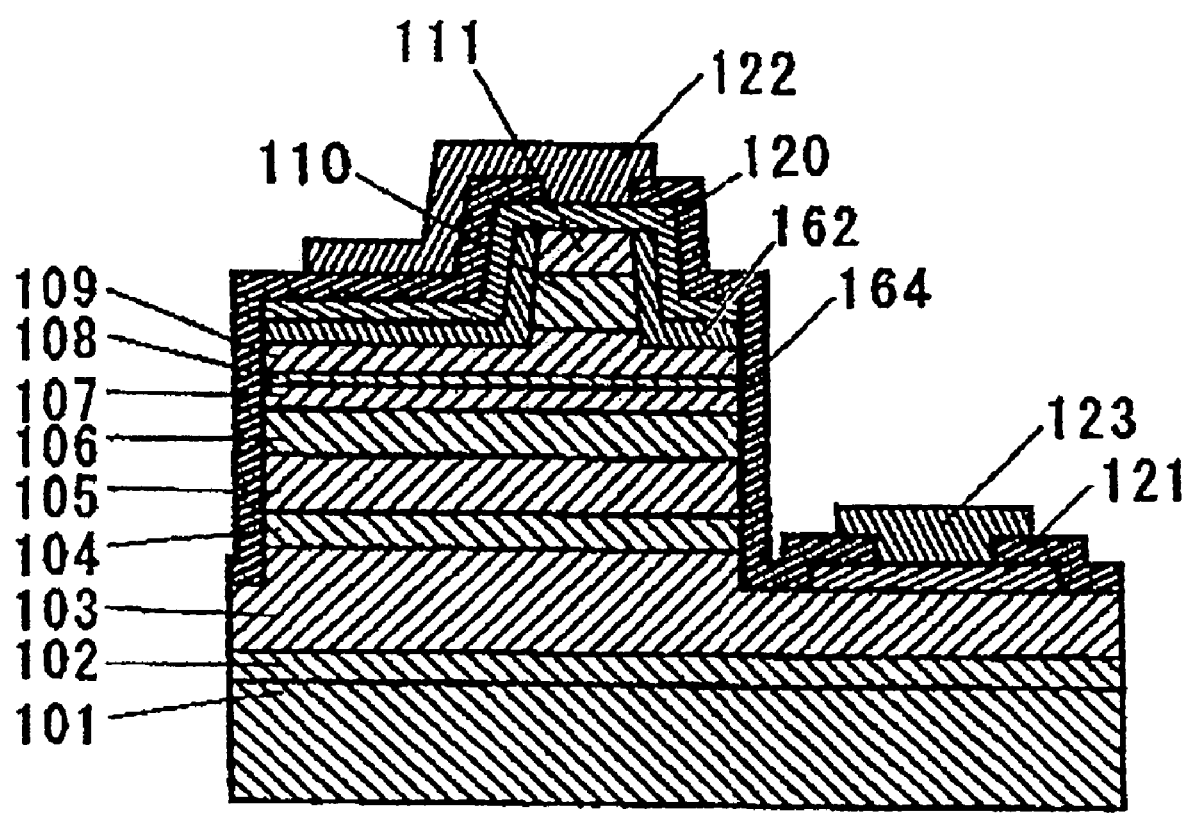
FIGS. 19 and 20 show sectional views of opto-electronic devices—a ridge type laser diode, based on a substrate for epitaxy in form of a bulk nitride mono-crystal according to the invention, and nitride semiconductor laser device as described herein, respectively.

In the enclosed drawing FIG. 19 shows a sectional view of a ridge type UV laser diode 100 having an active layer of $Al_xGa_{1-x}N$ ($0 \leq x < 0.7$) multi-quantum well (MQW) structure, which is formed on the inventive substrate 101 of GaN having a defect density of $10^6/cm^2$ made by the method of crystallization from supercritical solution disclosed in the Polish Patent Application No. P-347918.

As shown in FIG. 19, on the substrate 101 there are formed in turn by MOCVD method, a buffer layer 102 made of 4 µm $Al_{0.05}Ga_{0.95}N$, an n-type contact layer 103 of 5 µm $Al_{0.05}Ga_{0.95}N$ doped with Si, a crack-preventing layer 104 of 0.15 µm $In_{0.06}Ga_{0.94}N$ doped with Si, formed at 800° C., an n-type clad layer 105 of super lattice comprising 100 layers of 2.5 nm (25 Å) $Al_{0.05}Ga_{0.95}N$ doped with Si of $5 \times 10^{18}/cm^3$ and 100 layers of 2.5 nm-un-doped $Al_{0.1}Ga_{0.9}N$ and an n-type optical guide layer 106 of 0.15 µm un-doped $Al_{0.15}Ga_{0.85}N$. Any other layers than the n-type clad layer 105 may be omitted depending on the device characteristics.

On the n-type nitride semiconductor layers 103 to 106, there is formed an active layer 107, which comprises multi-quantum well structure made by combination of 4.5 nm un-doped GaN well-layer and 10 nm $Al_{0.15}Ga_{0.85}N$ barrier layer, wherein the well layer may be un-doped while the barrier layer may be doped with n-type dopant such as Si of $10^{17}$ to $10^{19}/cm^3$. In the preferred case, the most upside barrier layer may be un-doped to prevent Mg-diffusion from the next layer, p-type carrier confining layer 108 containing p-type dopant such as Mg.

On the last barrier layer, there is formed p-type nitride semiconductor comprising a p-type electron confining layer 108 of 10 nm p-$Al_{0.3}Ga_{0.7}N$ doped with Mg of $1 \times 10^{19}/cm^3$, a p-type optical guide layer 109 of 0.15 µm $Al_{0.04}Ga_{0.96}N$ doped with Mg, a p-type super lattice clad layer 110 of 90 layers (0.45 μm) of 2.5 nm p-$Al_{0.1}Ga_{0.9}N$/2.5 nm $Al_{0.05}Ga_{0.95}N$ (at least one of them doped with Mg) and a p-type contact layer 111 of 15 nm p-GaN doped with Mg of $10^{21}/cm^3$. Any other layers than the p-type clad layer 110 may be omitted depending on the device characteristics.

The laser diode is provided with a ridge strip made by etching in a manner that both side etched optical guide layer 109 is up to 0.1 μm in thickness. The described device is also provided with a strip-like p-electrode 120 of Ni/Au, a strip-like n-electrode 121 of Ti/Al, a protective layer 162 of $ZrO_2$, a dielectric multi-layer 164 of $SiO_2$ and $TiO_2$, and pad electrodes 122 and 123 of Ni—Ti—Au.

EXAMPLE 25

Semiconductor Blue Laser Diode/GaN Substrate

For a blue laser diode formation with an active layer of $In_yGa_{1-y}N$ (0<y<0.7) MQW structure in place of AlGaN MQW structure, except using a substrate of GaN having a defect density of $10^4/cm^2$ in place of substrate of GaN having a defect density of $10^6/cm^2$ in the above Example 24, the same procedure as the Example 24 is carried out to form a blue laser diode (LD) having the following structure:

p-GaN contact layer 111 doped with Mg of $10^{20}/cm^3$, p-type superlattice clad layer 110 of p-$Al_{0.05}Ga_{0.95}N$ doped with Mg/un-doped $Al_{0.05}Ga_{0.95}N$, p-type optical guide layer 109 of GaN, p-type electron confining layer 108 of p-$Al_{0.3}Ga_{0.7}N$ doped with Mg, MQW active layer 107 of un-doped $In_{0.1}Ga_{0.9}N$ well-layer/$In_{0.1}Ga_{0.9}N$ barrier layer doped with Si of $10^{17}$ to $10^{19}/cm^3$, n-type optical guide layer 106 of un-doped GaN, n-type superlattice clad layer 105 of $Al_{0.05}Ga_{0.95}N$ doped with Si/un-doped $Al_{0.05}Ga_{0.95}N$, crack-preventing layer 104 of $In_{0.05}Ga_{0.95}N$ doped with Si, n-type contact layer 103 of $Al_{0.05}Ga_{0.95}N$ doped with Si, buffer layer 102 of $Al_{0.05}Ga_{0.95}N$, and GaN substrate 101 having a defect density of $10^4/cm^2$.

EXAMPLE 26

Nitride Semiconductor Laser

Figure 20:
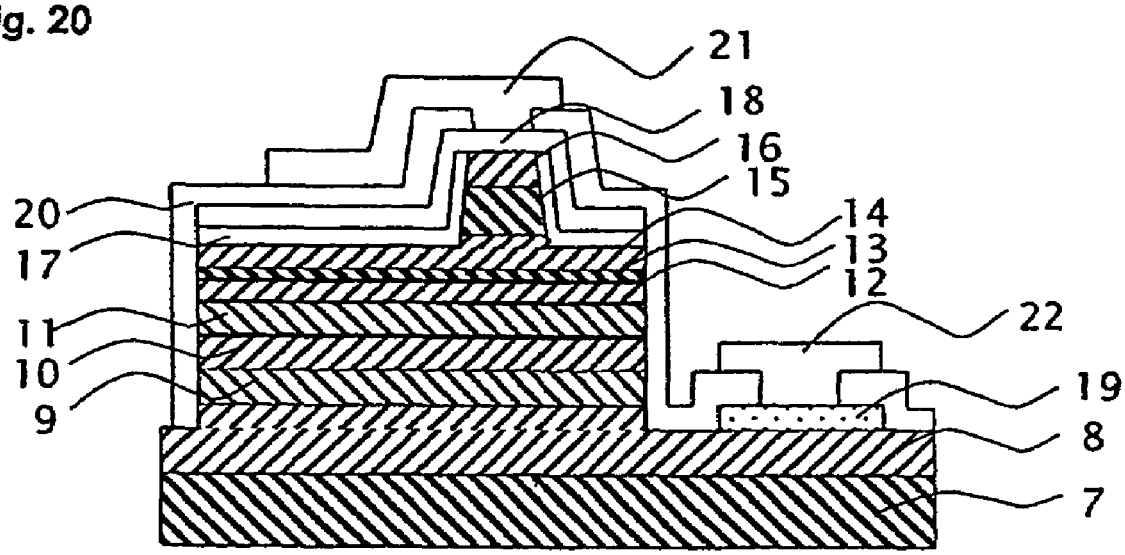

Substrate for epitaxy as obtained in Examples 22-23 was used in a nitride semiconductor laser as illustrated in FIG. 20, obtained by consecutive epitaxial depositing of nitride layers on the substrate for epitaxy as mentioned above, with a mono-crystalline nitride layer 7 formed by lateral overgrowth:

n-type GaN contact layer 8, crack-preventing layer 9 made of un-doped InGaN, n-type AlGaN superlattice clad layer 10 (emitter)

n-type GaN optical guide layer 11,

InGaN active layer 12 in form of single- or multi-quantum-well layer, p-type AlGaN barrier layer 13, p-type GaN optical guide layer 14, p-type AlGaN superlattice clad layer 15, and p-type GaN contact layer 16.

After the above layers were deposited, the whole device was annealed in MOCVD reactor under nitrogen at 700° C., in order to reduce resistivity of p-type nitride semiconductor layers.

After this annealing, the external surface of the p-type contact layer is protected with $SiO_2$ layer. Next, the structure is etched in order to form stripes, and to expose mirrors of a resonator and a surface of n-type sub-contact layer. The $SiO_2$ protective layer formed on the external surface of p-type contact layer is removed by wet etching.

Typically ridges are formed, which are then covered with $ZrO_2$ protective layer 17. At the top part of the ridges p-type electrodes 18 are formed so as to make an ohmic contact at p-type contact layers 16. Subsequently, on a surface of n-type contact layer 8 n-type electrodes 19 are formed and arranged in parallel to p-type electrodes. Also a dielectric multi-layer is made of $SiO_2/TiO_2$. Due to alternate arrangement of $SiO_2$ and $TiO_2$ layers within this dielectric multi-layer, and also as a result of the fact that this layer covers the whole structure except p-type and n-type electrodes, upon exciting the dielectric multi-layer functions as a layer 20 reflecting the radiation. Next p-type pad electrode 21 and n-type pad electrode 22 are formed. In effect nitride semiconductor laser as shown in FIG. 20 is obtained.

The thus produced nitride semiconductor lasers are equipped also with heat sink in order to remove heat effectively. Due to improved quality of a bulk mono-crystal of nitride in the substrate for epitaxy according to the present invention—resulting in an increased resistance to COD (Catastrophic Optical Damage)—it may be expected that lifetime of a 100 mW laser, operating in a continuous mode at threshold current density of $2.0 kA/cm^2$ and light wavelength 405 nm, will be increased significantly. The substrate for epitaxy according to the present invention being a layer of bulk mono-crystalline nitride containing gallium and optionally other above mentioned elements is suitable—due to its good crystalline quality—for use in opto-electronics for manufacturing optoelectronic semiconductor devices based on nitrides, in particular for manufacturing semiconductor laser diodes.

What is claimed is:

1. A bulk nitride mono-crystal comprising a mono-crystal of gallium containing nitride and its cross-section in a plane perpendicular to a c-axis of a hexagonal lattice of gallium nitride has a surface area greater than 100 mm², the mono-crystal having a thickness greater than 1.0 μm thick and a C-plane surface dislocation density less than $10^6/cm^2$, and having a volume sufficient to produce at least one further-processable A-plane or M-plane plate having a surface area of at least 100 mm², wherein it contains elements of halogen.

2. A bulk nitride mono-crystal according to claim 1, wherein the halogen content of said bulk mono-crystal of gallium is in the range of about 0.1 ppm or less.

3. A bulk nitride mono-crystal according to claim 1, wherein the A-plane or M-plane plate is non-polar.

4. A bulk nitride mono-crystal according to claim 1, wherein its quality does not deteriorate with thickness.

5. A bulk nitride mono-crystal according to claim 1, wherein it contains also elements of Group I (IUPAC 1989).

6. A bulk nitride mono-crystal according to claim 1, wherein it contains also elements such as Ti, Fe, Ce, Cr and Ni.

7. A bulk nitride mono-crystal according to claim 1, wherein additionally it contains donor and/or acceptor and/or magnetic dopants in concentrations from $10^{17}/cm^3$ to $10^{21}/cm^3$.

8. A bulk nitride mono-crystal according to claim 1, wherein it is crystallized on a surface of a seed crystal.

9. A bulk nitride mono-crystal according to claim 8, wherein a seed crystal is a gallium-nitride seed crystal.

10. A bulk nitride mono-crystal according to claim 9, wherein a seed is in form of a flat plate with two parallel faces perpendicular to c-axis of hexagonal lattice of gallium nitride, while the bulk mono-crystal of gallium nitride is crystallized on the nitrogen-terminated (000-1) face of the seed only, the gallium-terminated (0001) face being blocked in order to prevent growth of gallium nitride mono-crystal thereon.

11. A bulk nitride mono-crystal according to claim 8, wherein a seed crystal is a hetero-seed made of sapphire, silicon carbide or the like, with a top nitride buffer layer at least on its C-plane, consisting essentially of gallium nitride, and the bulk nitride mono-crystal is crystallized on the buffer layer, while at least one, preferably all the remaining surfaces of the hereto-seed are covered with a protective mask.

12. A bulk nitride mono-crystal according to claim 6, wherein it is crystallized on a plurality of surfaces susceptible for lateral growth of the nitride, the surfaces being spaced apart from each other and the remaining surfaces of the seed crystal are covered with a protective mask.

13. A bulk nitride mono-crystal according to claim 1, wherein its surface dislocation density on nitrogen-terminated face is close to $10^4/cm^2$ and at the same time the full width at half maximum (FWHM) of the X-ray rocking curve is close to 60 arcsec.

14. A bulk nitride mono-crystal comprising a mono-crystal of gallium containing nitride and its cross-section in a plane perpendicular to a c-axis of a hexagonal lattice has a surface area greater than 100 mm², the mono-crystal having a thickness greater than 1.0 μm thick and a C-plane surface dislocation density less than $10^6/cm^2$, and having a volume sufficient to produce at least one further-processable A-plane or M-plane plate having a surface area of at least 100 mm², wherein the mono-crystal has a minimum amount of a halogen.

15. A bulk nitride mono-crystal according to claim 14, wherein the halogen content of said bulk mono-crystal is in the range of about 0.1 ppm or less.

16. A bulk nitride mono-crystal according to claim 14, wherein the A-plane or M-plane plate is non-polar.

17. A bulk nitride mono-crystal according to claim 14, wherein quality of the mono-crystal does not deteriorate with thickness.

18. A bulk nitride mono-crystal according to claim 14, wherein the mono-crystal also contains elements of Group I (IUPAC 1989).

19. A bulk nitride mono-crystal according to claim 14, wherein the mono-crystal also contains elements such as Ti, Fe, Co, Cr and Ni.

20. A bulk nitride mono-crystal according to claim 14, wherein the mono-crystal also contains donor and/or acceptor and/or magnetic dopants in concentrations from $10^{17}/cm^3$ to $10^{21}/cm^3$.

21. A bulk nitride mono-crystal according to claim 14, wherein the mono-crystal is crystallized on a surface of a seed crystal.

22. A bulk nitride mono-crystal according to claim 21, wherein the seed crystal is a gallium-nitride seed crystal.

23. A bulk nitride mono-crystal according to claim 22, wherein the seed is shaped as a flat plate with two parallel faces perpendicular to the c-axis of hexagonal lattice of gallium nitride, while the bulk mono-crystal is crystallized on a nitrogen-terminated (000-1) face of the seed only, a gallium-terminated (0001) face being blocked in order to prevent growth of gallium nitride mono-crystal thereon.

24. A bulk nitride mono-crystal according to claim 21, wherein the seed crystal is a hetero-seed made of at least one of sapphire and silicon carbide, with a top nitride buffer layer at least on its C-plane, consisting essentially of gallium nitride, and the bulk nitride mono-crystal is crystallized on the buffer layer, while at least one of the remaining surfaces of the hereto-seed are covered with a protective mask.

25. A bulk nitride mono-crystal according to claim 19, wherein the mono-crystal is crystallized on a plurality of surfaces susceptible for lateral growth of the nitride, the surfaces being spaced apart from each other and the remaining surfaces of the seed crystal are covered with a protective mask.

26. A bulk nitride mono-crystal according to claim 14, wherein a surface dislocation density of the mono-crystal on a nitrogen-terminated face is close to $10^4/cm^2$ and at the same time the full width at half maximum (FWHM) of the X-ray rocking curve is close to 60 arcsec.

* * * * *